(12) United States Patent
Park et al.

(10) Patent No.: US 8,009,473 B2
(45) Date of Patent: Aug. 30, 2011

(54) SEMICONDUCTOR MEMORY DEVICE INCLUDING MEMORY CELL ARRAY HAVING MEMORY CELLS USING FLOATING BODY TRANSISTORS

(75) Inventors: Duk-Ha Park, Suwon-si (KR); Ki-Whan Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 312 days.

(21) Appl. No.: 12/344,765

(22) Filed: Dec. 29, 2008

(65) Prior Publication Data
US 2009/0175063 A1  Jul. 9, 2009

(30) Foreign Application Priority Data
Jan. 3, 2008  (KR) ................. 10-2008-0000825

(51) Int. Cl.
*G11C 11/34* (2006.01)
(52) U.S. Cl. ............... 365/185.05; 365/174; 365/185.13
(58) Field of Classification Search ............. 365/185.05, 365/185.17, 185.11, 174, 185.13
See application file for complete search history.

(56) References Cited

U.S. PATENT DOCUMENTS

| | | | | |
|---|---|---|---|---|
| 5,523,249 | A * | 6/1996 | Gill et al. | 438/263 |
| 5,587,960 | A * | 12/1996 | Ferris | 365/230.03 |
| 5,986,934 | A * | 11/1999 | Kao et al. | 365/185.18 |
| 6,888,770 | B2 | 5/2005 | Ikehashi | |
| 7,208,780 | B2 | 4/2007 | Ohsawa | |
| 7,330,386 | B2 | 2/2008 | Kuroda et al. | |
| 7,839,686 | B2 * | 11/2010 | Shibata | 365/185.17 |
| 2006/0049444 | A1 | 3/2006 | Shino | |
| 2007/0013007 | A1 | 1/2007 | Kusunoki et al. | |
| 2007/0019490 | A1 | 1/2007 | Kuroda et al. | |
| 2007/0058427 | A1 | 3/2007 | Okhonin et al. | |
| 2007/0241391 | A1 * | 10/2007 | Shimizu et al. | 257/315 |
| 2009/0129158 | A1 * | 5/2009 | Sato et al. | 365/185.03 |

FOREIGN PATENT DOCUMENTS

| | | |
|---|---|---|
| JP | 2004335031 | 11/2004 |
| JP | 2005251791 | 9/2005 |
| JP | 2006080280 | 3/2006 |
| JP | 2007035115 | 2/2007 |
| JP | 2007073680 | 3/2007 |
| KR | 1020000041748 A | 7/2000 |
| KR | 1020070013208 A | 1/2007 |

* cited by examiner

*Primary Examiner* — Vu A Le
*Assistant Examiner* — Han Yang
(74) *Attorney, Agent, or Firm* — Volentine & Whitt, PLLC

(57) ABSTRACT

A semiconductor memory device includes a memory cell array, which includes a cell array having multiple cell blocks. Each cell block includes source and word lines arranged in one direction, bit lines arranged in a perpendicular direction, and memory cells having corresponding floating bodies. Adjacent memory cells share source or drain regions to form common source or drain regions, respectively. The source regions are arranged in a word line direction and connected to corresponding source lines, and the drain regions are arranged in the bit line direction and connected to corresponding bit lines. Gates of the memory cells are arranged in the word line direction and are connected to form the word lines. The source lines are formed on a layer of the word lines, and the bit lines are formed at a different layer to be insulated from the word and source lines.

24 Claims, 24 Drawing Sheets

SEMICONDUCTOR MEMORY DEVICE INCLUDING MEMORY CELL ARRAY HAVING MEMORY CELLS USING FLOATING BODY TRANSISTORS

PRIORITY CLAIM

A claim of priority is made to Korean Patent Application No. 10-2008-0000825, filed Jan. 3, 2008, in the Korean Intellectual Property Office, the subject matter of which is hereby incorporated by reference.

SUMMARY

Embodiments of the present invention relate to a semiconductor memory device, and more particularly, to a semiconductor memory device including a memory cell array having dynamic memory cells using a floating body.

A memory cell array including dynamic memory cells using floating body transistors may use bipolar junction transistor operation of the floating body transistors for high-speed operation and excellent data retention characteristics.

A dynamic memory cell using floating body transistors configured to read and write data using bipolar junction transistor operation, and a memory cell array having the same are disclosed, for example, in U.S. Patent Application Publication No. 2007/0058427, the subject matter of which is hereby incorporated by reference.

FIG. 1 illustrates an example of a conventional dynamic memory cell using floating body transistors. The dynamic memory cell includes a substrate 10, an insulating layer 12 formed on the substrate 10, a source region 14 and a drain region 16 separately formed on the insulating layer 12, a floating body region 18 formed between the source region 14 and the drain region 16, an insulating layer 20 formed on a floating body region 18, and a gate region 22 formed on the insulating layer 20. Operation of the dynamic memory cell shown in FIG. 1 is described, for example, in U.S. Patent Application Publication No. 2007/0058427.

According to illustrative embodiments, a semiconductor memory device includes a memory cell array, which includes a cell array having multiple cell blocks. Each cell block includes source lines and word lines arranged in the same direction, bit lines arranged in a direction perpendicular to the word lines, and memory cells having corresponding floating bodies. Adjacent memory cells, which are adjacent in a bit line direction, share source regions or drain regions to form common source regions or common drain regions, respectively. The source regions are arranged in a word line direction and connected to corresponding source lines, and the drain regions are arranged in the bit line direction and connected to corresponding bit lines. Gates of the memory cells are arranged in the word line direction and are connected to form the word lines. The source lines are formed on a layer of the word lines to be insulated from the word lines, and the bit lines are formed at a layer different from a layer of the source lines and on the layer of the word lines to be insulated from the word lines and the source lines.

According to other illustrative embodiments, a semiconductor memory device includes a memory cell array, which includes a cell array having multiple cell blocks. Each cell block includes source lines and word lines arranged in the same direction, bit lines arranged in a direction perpendicular to the word lines, and memory cells having corresponding floating bodies. Drain regions of every two memory cells adjacent in a bit line direction among the memory cells are shared, and source regions of the memory cells arranged in the bit line direction are separated. The source regions arranged in a word line direction are connected to corresponding source lines, and the drain regions arranged in the bit line direction are connected to corresponding bit lines. Gates of the memory cells arranged in the word line direction are connected to form the word lines. The source lines are formed on a layer of the word lines to be insulated from the word lines, and the bit lines are formed at a different layer from the layer of the source lines and on the layer of the word lines to be insulated from the word lines and the source lines.

The source lines may overlap the common source regions arranged in the word line direction. The gate may be formed of polysilicon, and the source lines and the bit lines may be formed of metal.

The bit lines may overlap the common drain regions arranged in the bit line direction. Also, the common drain regions and the overlapping bit lines may be interconnected by first contacts.

Landing pads may be arranged at the same layer as the source lines to overlap the common drain regions. The common drain regions and the overlapping landing pads may be interconnected by second contacts, and the landing pads and the bit lines overlapping the common drain regions may be interconnected by third contacts.

The first contacts may be formed in the common source regions, and the first contacts arranged in the word line direction may be connected to form the source lines. The source lines and the common source regions overlapped by the source lines may be interconnected by first contacts.

In an illustrative embodiment, the memory cell array may further include multiple sense amplifiers arranged between the cell blocks for sensing data on the bit line; a row controller arranged at one side of the cell array and at respective ends of the word lines, for controlling the word lines and the source lines; and a column controller arranged at the another side of the cell array and at respective ends of the bit lines, for controlling the bit lines.

In another illustrative embodiment, the memory cell array may further include at least two cell arrays arranged in the word line direction; a row controller arranged at one side of the memory cell array and at respective ends of the word lines, for controlling the word lines and the source lines; and at least two column controllers arranged at another side of the at least two cell arrays and at respective ends of the bit lines of the at least two cell arrays, for controlling the bit lines. The device may further include overlapping word lines arranged at a different layer from the layer of the bit lines and the source lines and on the layer of the word lines to overlap the word lines.

The overlapping word lines may be formed of metal. The overlapping word lines overlap the word lines between the at least two cell arrays and are interconnected by second contacts. Landing pads may be additionally arranged at the same layer as the source lines to overlap the common drain regions, and the word lines and respective main word lines may be connected between the at least two cell arrays. The landing pads may be additionally arranged at the same layer as the bit lines between the at least two cell arrays to overlap the word lines and the respective main word lines. The word lines and the overlapping landing pads may be interconnected by second contacts, and the landing pads and the overlapping respective main word lines may be interconnected by third contacts.

In still another illustrative embodiment, the memory cell array may further include at least two cell arrays arranged in the word line direction; multiple sense amplifiers arranged between the cell blocks of each cell array for sensing data on the bit line; a row controller arranged at one side of the memory cell array and at respective ends of the word lines, for controlling the word lines; at least two column controllers arranged at another side of the memory cell array and at respective ends of the bit lines of the at least two cell arrays, for controlling the bit lines; and a source controller between the cell arrays for controlling the source lines.

In yet another illustrative embodiment, the memory cell array may further include at least two cell arrays arranged in the word line direction; sub word line drivers arranged between the cell blocks arranged in the word line direction, for controlling the word lines; sense amplifiers arranged between the cell blocks arranged in the bit line direction, for sensing data on the bit lines; and conjunctions arranged between the sub word line drivers and the sense amplifiers and configured to generate selection signals to select the sub word line.

The source lines may be formed to overlap the common source regions arranged in the word line direction. The bit lines may be arranged to overlap the common drain regions arranged in the bit line direction. Overlapping source lines may be arranged at a different layer from layers of the source lines and the bit lines and on a layer of the word lines in the word line direction to overlap the source lines, and main word lines are arranged in the word line direction. The source lines may be connected with the overlapping source lines by contacts, respectively. Landing pads may be additionally arranged at the same layer as the bit lines to be insulated from the bit lines and to overlap the source lines and the overlapping source lines. The source lines and the landing pads may be interconnected by first contacts, and the landing pads and the overlapping source lines may be interconnected by second contacts.

The memory cell array may further include a row controller arranged at one side of the cell array and at respective ends of the word lines for controlling the overlapping source lines and the main word lines; and a column controller arranged at another side of the cell array and at respective ends of the bit lines for controlling the bit lines. The respective sub word line drivers may combine signals on the main word lines with the selection signals to drive the word lines.

BRIEF DESCRIPTION OF THE DRAWINGS

Embodiments of the present invention will be described with reference to the attached drawings, in which.

DETAILED DESCRIPTION OF THE EMBODIMENTS

Figure 1:
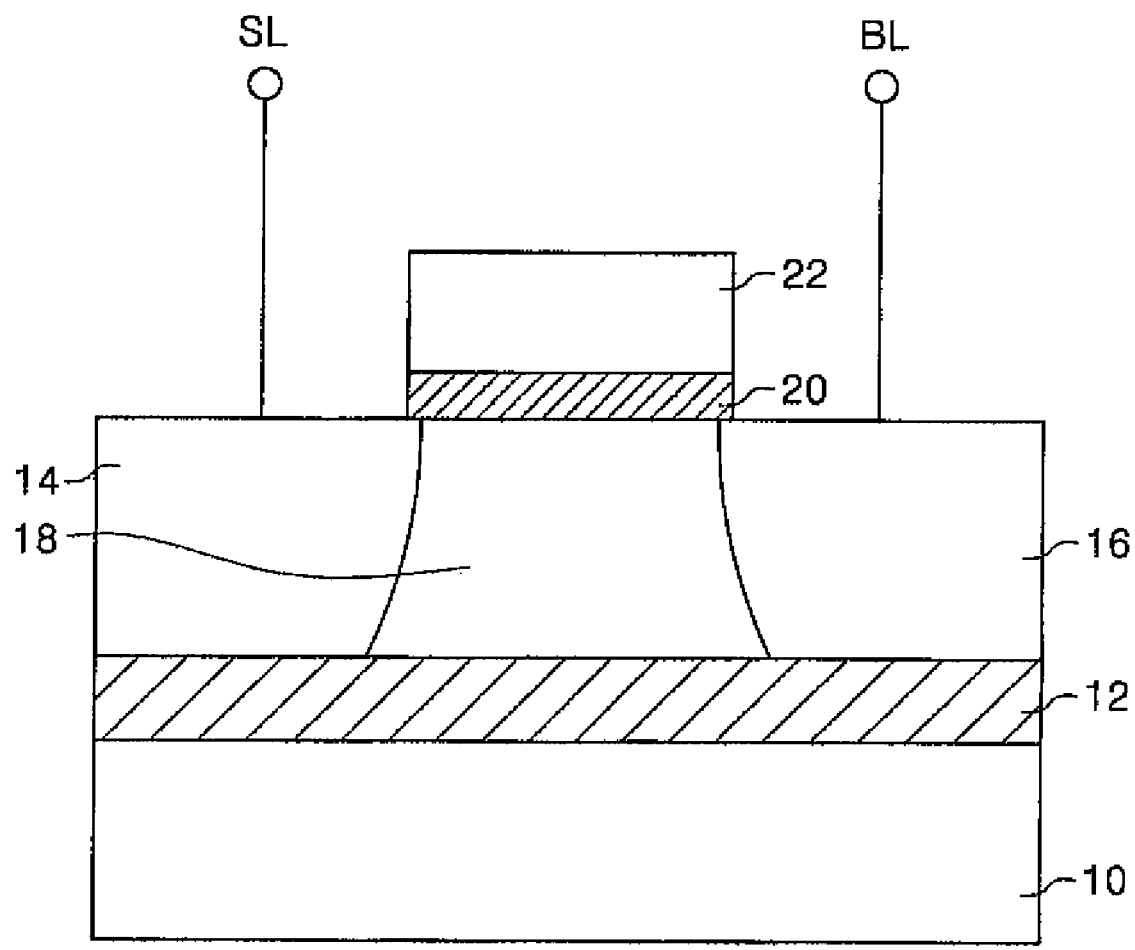
FIG. 1 is a cross-sectional view of an example of a conventional dynamic memory cell using floating body transistors.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, in the drawings, the sizes and relative sizes of various aspects, such as the layers and regions, may be exaggerated for clarity.

Figure 2:
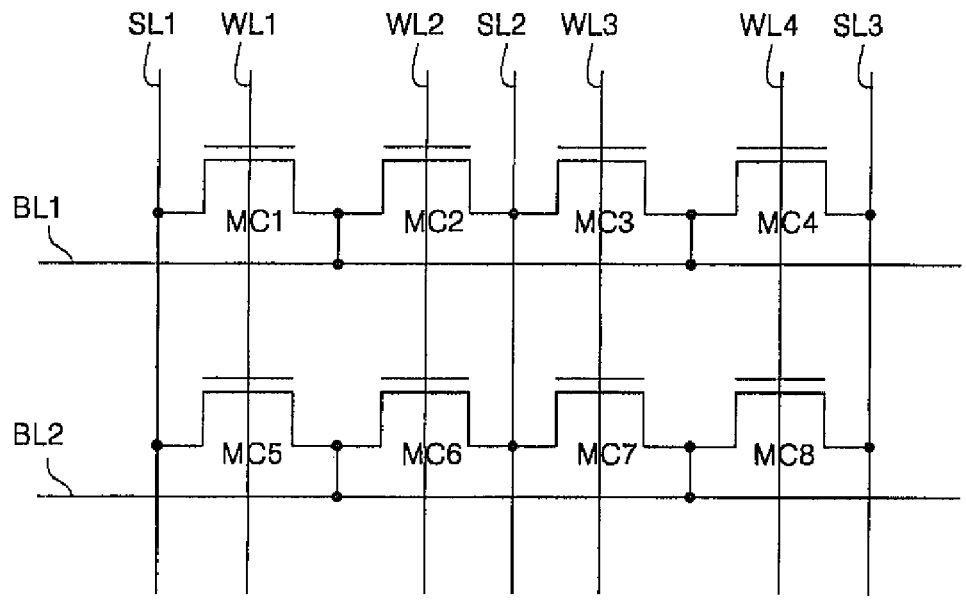
FIG. 2 is a circuit diagram illustrating an example of a conventional memory cell array including dynamic memory cells using floating body transistors.

FIG. 2 is a circuit diagram illustrating an example of a conventional memory cell array including dynamic memory cells using floating body transistors. The memory cell array includes memory cells MC1 to MC8 having gates, drains and sources respectively connected to word lines WL1 to WL4, bit lines BL1 and BL2 and source lines SL1 to SL3, and having a floating body.

In FIG. 2, the word lines WL1 to WL4 and the source lines SL1 to SL3 are arranged in the same direction, and the bit lines BL1 and BL2 are arranged perpendicular to the word lines WL1 to WL4. The respective gates of the memory cells MC1 to MC8 are connected to the corresponding word lines WL1 to WL4, the sources of the two memory cells adjacent in a bit line direction are connected to corresponding one of the source lines SL1 to SL3, and the drains of the two memory cells adjacent in a bit line direction are connected in common to one of the bit lines BL1 and BL2. The source lines are less in number than the word lines.

Figure 3:
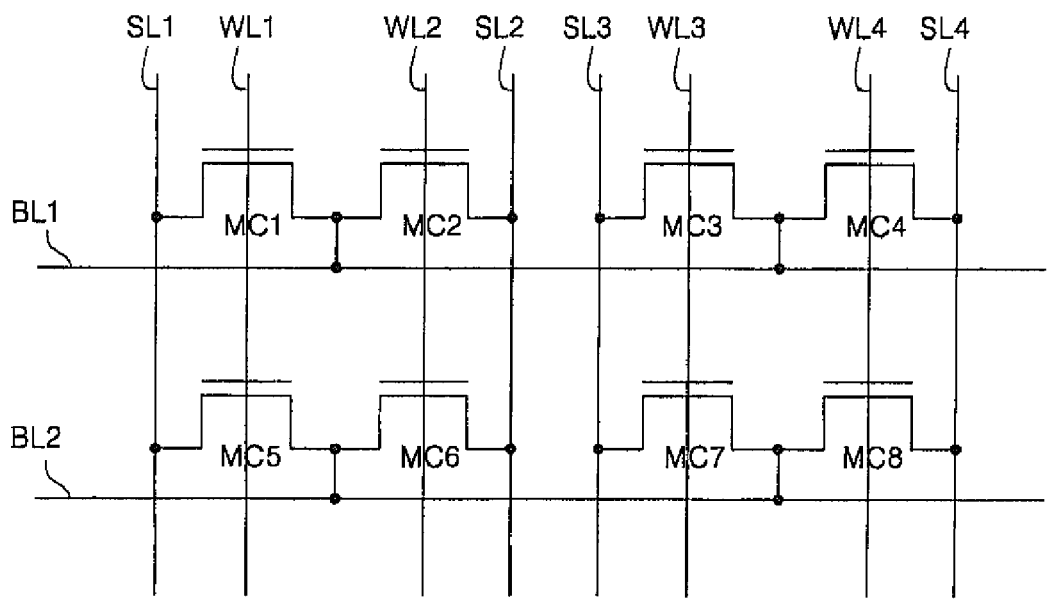
FIG. 3 is a circuit diagram illustrating another example of a conventional memory cell array including dynamic memory cells using floating body transistors.

FIG. 3 is a circuit diagram illustrating another example of a conventional memory cell array including dynamic memory cells using floating body transistors. The memory cell array includes memory cells MC1 to MC8 having gates, drains and sources respectively connected to word lines WL1 to WL4, bit lines BL1 and BL2 and source lines SL1 to SL4, and having floating bodies.

In FIG. 3, the word lines WL1 to WL4 and the source lines SL1 to SL4 are arranged in the same direction, and the bit lines BL1 and BL2 are arranged perpendicular to the word lines WL1 to WL4. The drains of two memory cells adjacent in the bit line direction are connected in common to one of the bit lines, and the respective sources of the memory cells MC1 to MC8 are connected to the corresponding source lines SL1 to SL4. In the memory cell array shown in FIG. 3, the source lines are the same in number as the word lines.

The memory cell arrays shown in FIGS. 2 and 3 are disclosed in U.S. Patent Application Publication No. 2007/0058427, discussed above, and operation of the memory cell arrays may be understood by referring to the description therein.

Figure 4:
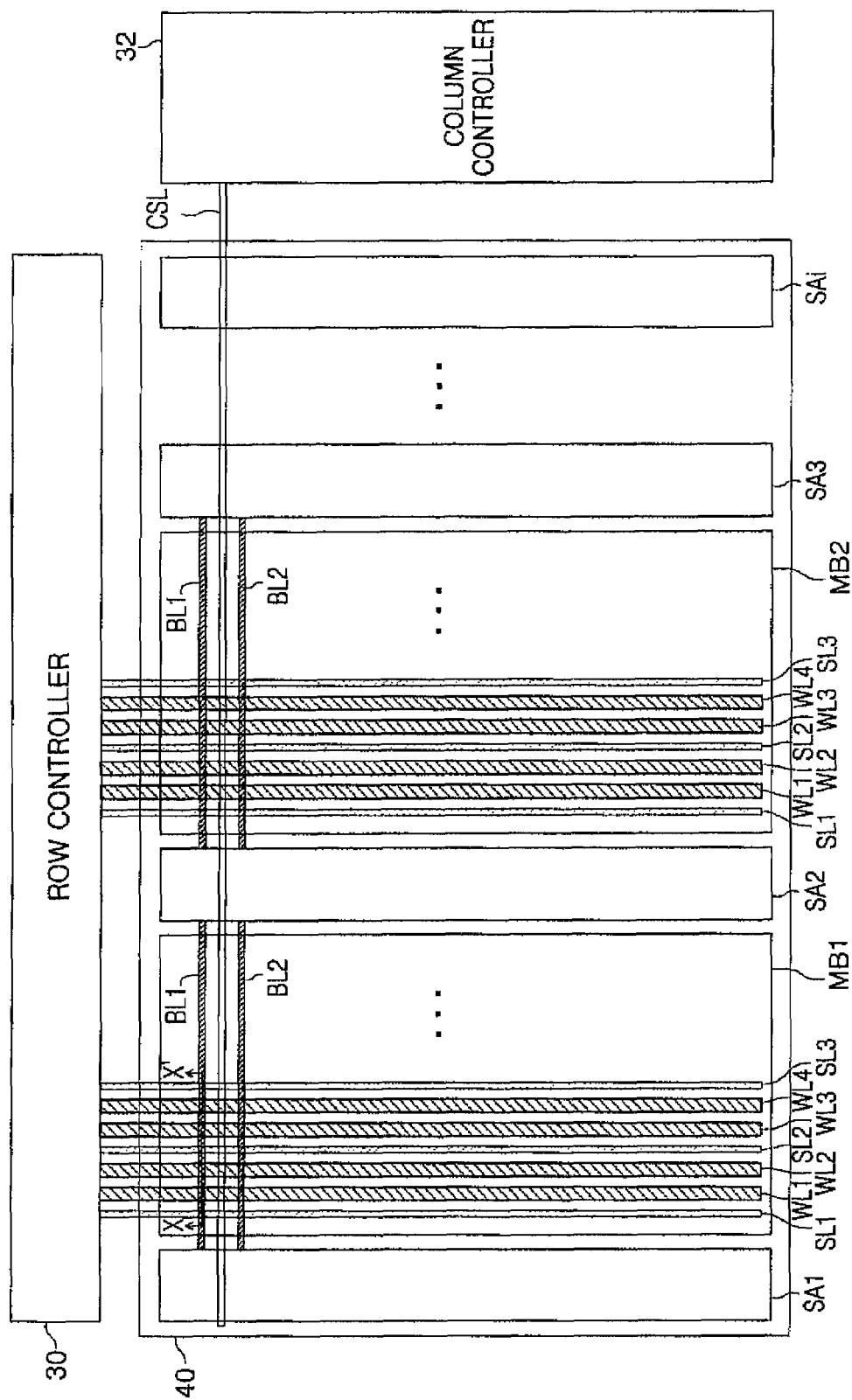
FIG. 4 is a layout of a first type of memory cell array including dynamic memory cells using floating body transistors, according to a first example embodiment.

FIG. 4 is a layout of a first type of memory cell array, having the structure shown in FIG. 2, for example, including dynamic memory cells using floating body transistors, according to a first illustrative embodiment.

In FIG. 4, the memory cell array includes a row controller 30, a column controller 32, and a cell array 40. The cell array 40 includes multiple cell blocks MB1, MB2, . . . and multiple sense amplifiers SA1, SA2, SA3, . . . , SAi.

In FIG. 4, the cell blocks MB1, MB2, . . . are arranged in a direction extending in the same direction of bit lines BL1, BL2, . . . , and each of the sense amplifiers SA1, SA2, SA3, . . . , SAi is arranged between and shared by the adjacent cell blocks MB1, MB2, . . . . In the cell blocks MB1, MB2, . . . , respective word lines WL1 to WL4, . . . and respective source lines SL1 to SL3, . . . are arranged perpendicular to the bit lines. The row controller 30 is arranged at an end of the word lines and at one side of the cell array 40 and extends in the extending direction of the bit lines. The column controller 32 is arranged at an end of the bit lines and at another side of the memory cell array 40, and extends in an extending direction of the word lines.

In FIG. 4, gate polysilicon for forming gates of the memory cells arranged in a word line direction serves as the word lines WL1 to WL4, . . . , and the source lines SL1 to SL3, . . . are arranged on the region of the word lines WL1 to WL4, . . . . The bit lines BL1, BL2, . . . are arranged on the layer of the source lines SL1 to SL3, . . . . A column selection signal line CSL is arranged at the same layer as the bit lines BL1, BL2, . . . or at a different layer from the layer of the source lines SL1 to SL3, . . . and the bit lines BL1, BL2, . . . in the bit line direction.

Figure 5:
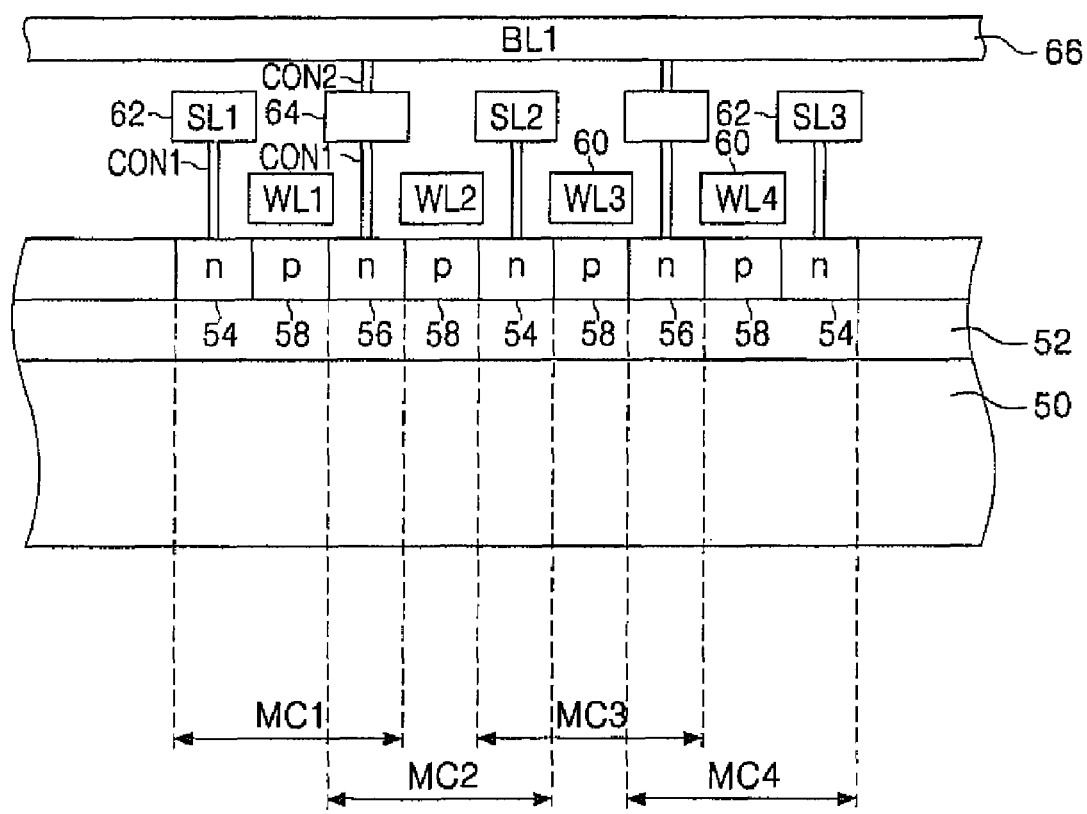
FIG. 5 is a cross-sectional view of the cell block taken along line X-X' in FIG. 4 according to an embodiment.

FIG. 5 is a cross-sectional view of a cell block taken along line X-X' in FIG. 4, according to an illustrative embodiment. The cell block includes a substrate 50, an insulating layer 52 formed on the substrate 50, source regions 54 and drain regions 56 of memory cells MC1 to MC4 separately formed on the insulating layer 52, floating body regions 58 formed between the source regions 54 and the drain regions 56, and gate regions 60 of the memory cells MC1 to MC4 formed on the floating body regions 58 to be insulated from the floating body regions 58. The gate regions 60 are formed of gate polysilicon, for example, which serves as the word lines WL1 to WL4. The source lines SL1 to SL3 62 and landing pads 64 are formed of metal on the layer of the word lines WL1 to WL4 to be insulated from the word lines WL1 to WL4. The source lines 62 are connected to the source regions 54 of the memory cells MC1 to MC4 by contacts CON1, and the landing pads 64 are connected to the drain regions 56 by the contacts CON1. The bit line BL1 66 is formed on the layer of the source lines 62 to be insulated from the source lines 62, and is connected with the landing pads 64 by contacts CON2.

Figure 6:
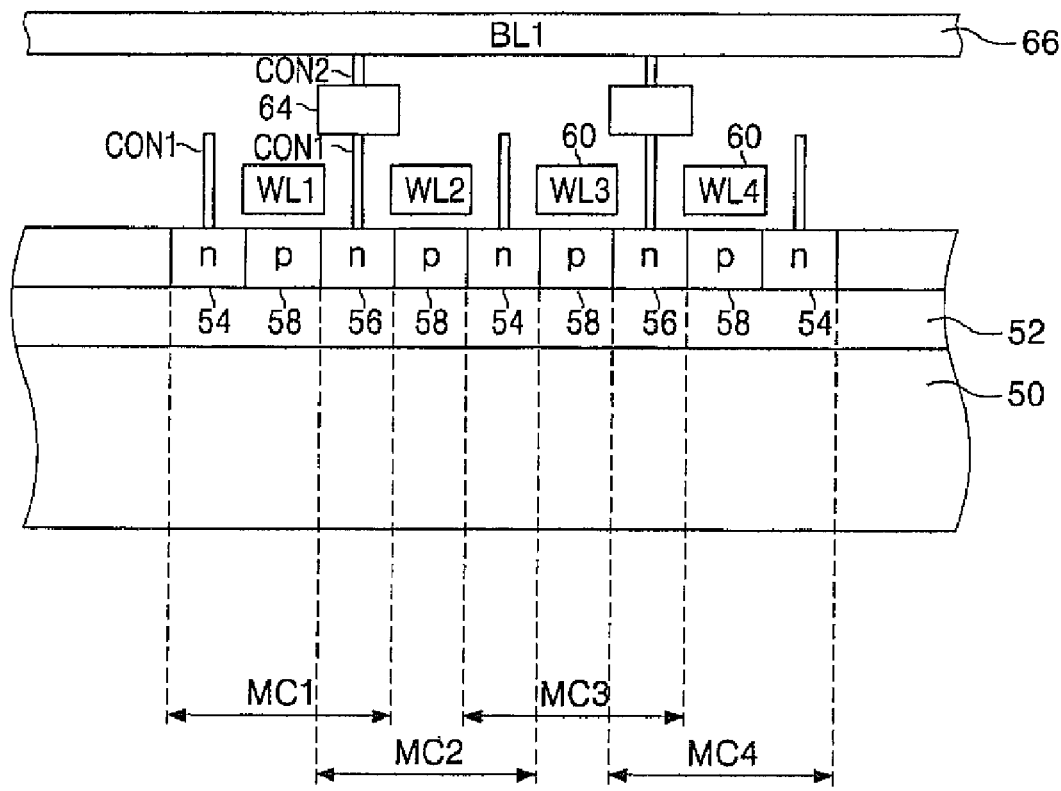
FIG. 6 is a cross-sectional view of the cell block taken along line X-X' in FIG. 4 according to another embodiment.

FIG. 6 is a cross-sectional view of a cell block taken along line X-X' in FIG. 4, according to another illustrative embodiment. The structure shown in FIG. 6 is substantially the same as that shown in FIG. 5, except that the source lines 62 are not formed as metal lines, as in FIG. 5, but use the contacts CON1 connected to the source regions 54 of the memory cells MC1 to MC4.

Figure 7:
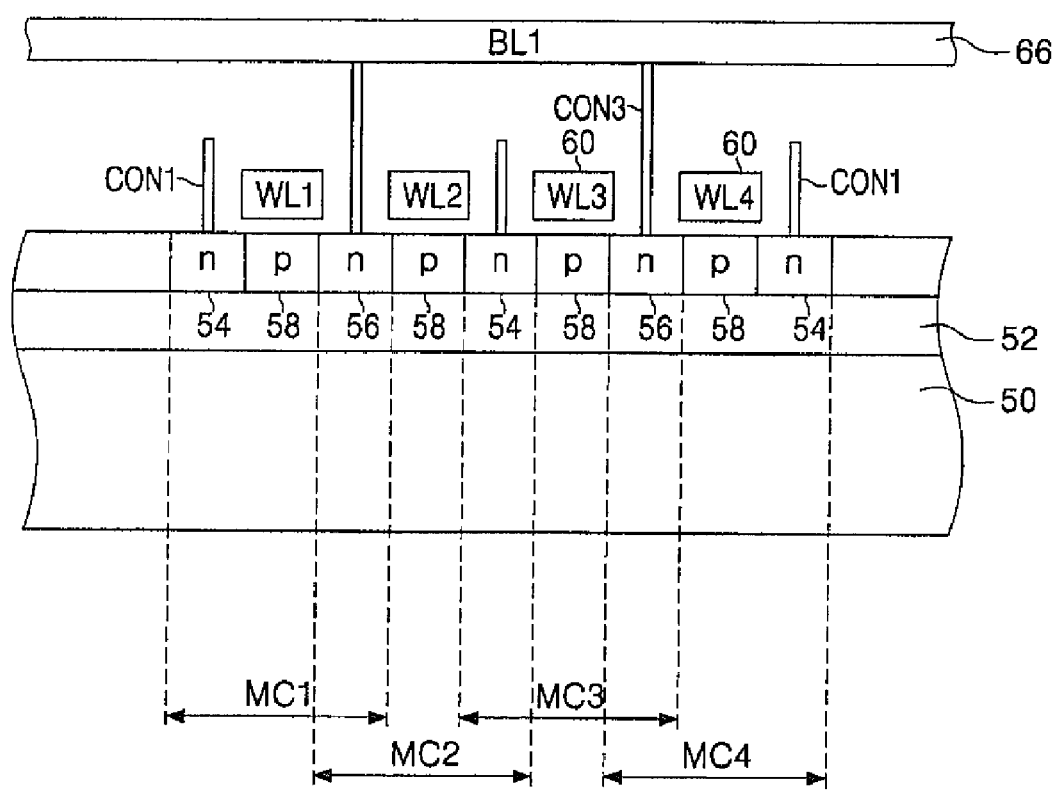
FIG. 7 is a cross-sectional view of the cell block taken along line X-X' in FIG. 4 according to yet another embodiment.

FIG. 7 is a cross-sectional view of a cell block taken along line X-X' in FIG. 4, according to yet another illustrative embodiment. In the structure shown in FIG. 6, the source lines 62 and the landing pads 64 are not formed as metal lines, the contacts CON1 connected to the source regions 54 of the memory cells MC1 to MC4 are used as the source lines 62, and the drain regions 56 are directly connected with the bit line BL1 by contacts CON3.

Figure 8:
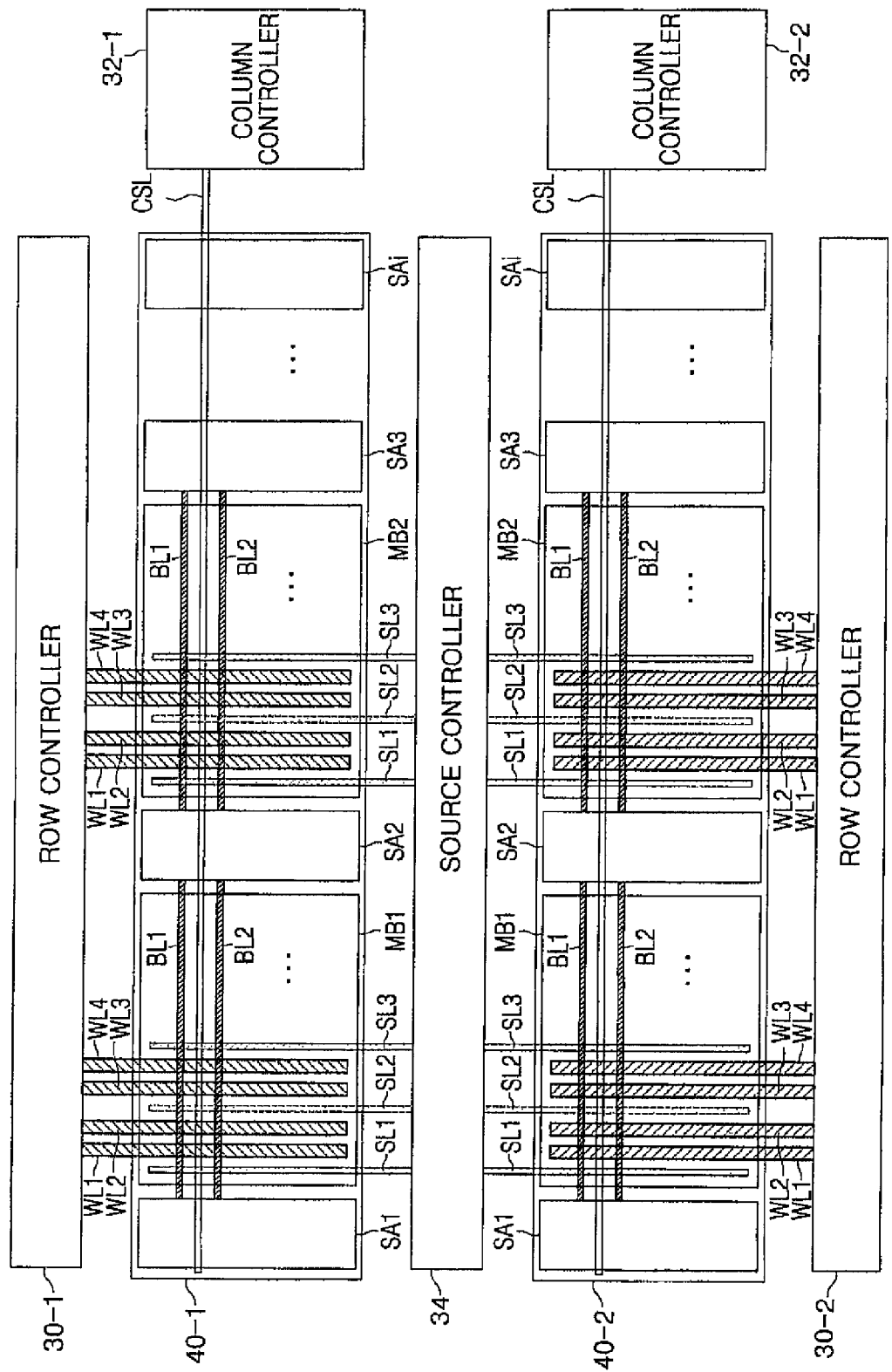
FIG. 8 is a layout of a first type of memory cell array including dynamic memory cells using floating body transistors, according to a second example embodiment.

FIG. 8 is a layout of a first type of memory cell array, having the structure shown in FIG. 2, for example, including dynamic memory cells using floating body transistors, according to a second illustrative embodiment.

In FIG. 8, the memory cell array includes row controllers 30-1 and 30-2, column controllers 32-1 and 32-2, a source controller 34, and cell arrays 40-1 and 40-2. Each of the cell arrays 40-1 and 40-2 includes multiple cell blocks MB1, MB2, . . . and multiple sense amplifiers SA1, SA2, SA3, . . . , SAi.

In the layout of FIG. 8, the cell arrays 40-1 and 40-2 are arranged separately, as compared to cell array 40 of FIG. 4. The source controller 34 having a function of driving source lines SL1 to SL3, . . . is arranged between the cell arrays 40-1 and 40-2, with the row controllers 30-1 and 30-2 having no function of driving the source lines SL1 to SL3, . . . . The row decoders 30-1 and 30-2 are arranged at respective ends of word lines of the cell arrays 40-1 and 40-2 in regions facing the source controller 34 and extend in the extending direction of the bit lines. The column controllers 32-1 and 32-2 are arranged at respective ends of the bit lines of the cell arrays 40-1 and 40-2 at respective sides of the cell arrays 40-1 and 40-2 and extend in the extending direction of the word lines.

In FIG. 8, gate polysilicon, which forms gates of the memory cells arranged in the word line direction, serves as word lines WL1 to WL4, . . . . Source lines SL1 to SL3, are arranged on the region of the word lines WL1 to WL4, . . . and bit lines BL1, BL2, are arranged on the layer of the source lines SL1 to SL3, . . . . Column selection signal lines CSL are arranged at the same layer as the bit lines BL1, BL2, . . . or at a different layer from the layer of the source lines SL1 to SL3, . . . and the bit lines BL1, BL2, . . . in the bit line direction.

In the memory cell array shown in FIG. 8, the word lines WL1 to WL4, . . . and the source lines SL1 to SL3, . . . are separated and accordingly shorter in length than the word lines WL1 to WL4, . . . and the source lines SL1 to SL3, . . . of the memory cell array shown in FIG. 4, thereby reducing line load and accordingly signal transmission delay. Further, since the source controller 34 is separated from the row controller 30-1, word line drivers and source line drivers (not shown) are easily arranged in the row controller 30-1, and line loads of the source lines SL1 to SL3, . . . and the word lines WL1 to WL4, . . . are reduced. This can reduce sizes of the word line drivers and the source line drivers, and accordingly the layout area.

Various cross-sectional views of the cell block taken along line X-X' in FIG. 8 may be the same as the illustrative embodiments shown in FIGS. 5 to 7, respectively.

Figure 9:
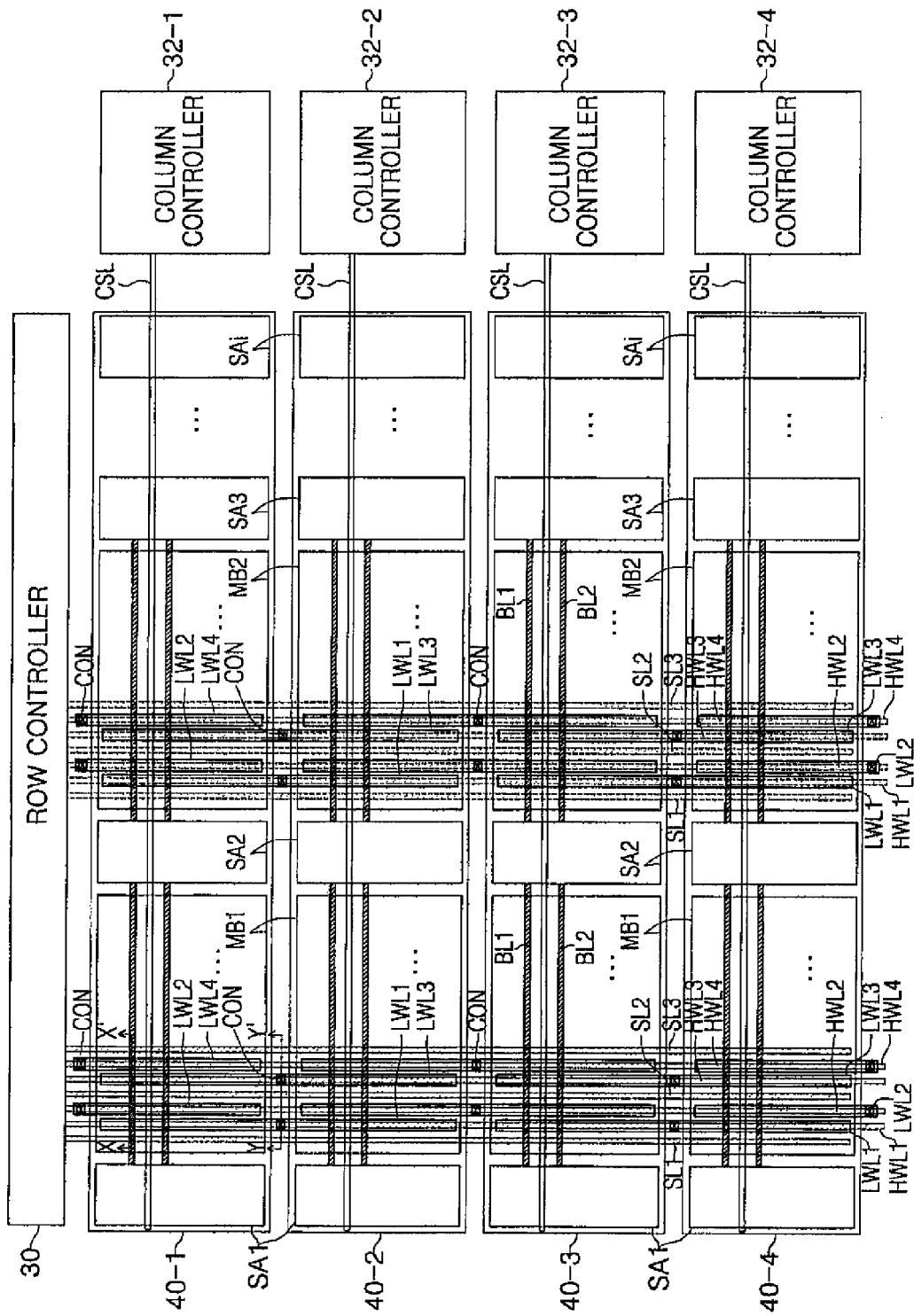
FIG. 9 is a layout of a first type of memory cell array including dynamic memory cells using floating body transistors, according to a third example embodiment.

FIG. 9 is a layout of a first type of memory cell array, having the structure shown in FIG. 2, for example, including dynamic memory cells using floating body transistors, according to a third illustrative embodiment.

In FIG. 9, the memory cell array includes a row controller 30, column controllers 32-1 to 32-4, and cell arrays 40-1 to 40-4. Each of the cell arrays 40-1 to 40-4 includes multiple cell blocks MB1, MB2, . . . and multiple sense amplifiers SA1, SA2, SA3, . . . , SAi.

In the layout of FIG. 9, the four cell arrays 40-1 to 40-4 are divided from one another, as compared to cell array 40 of FIG. 4, and the column controllers 32-1 to 32-4 are arranged to correspond to the cell arrays 40-1 to 40-4.

In FIG. 9, gate polysilicon, which form gates of the memory cells arranged in a word line direction, serves as lower word lines LWL1 to LWL4, . . . . Source lines SL1 to SL3, . . . are arranged on the region of the lower word lines LWL1 to LWL4. Bit lines BL1, BL2, . . . are arranged on the layer of the source lines SL1 to SL3, . . . . Column selection signal lines CSL are arranged at the same layer as the bit lines BL1, BL2, . . . or at a different layer from the layer of the source lines SL1 to SL3, . . . and the bit lines BL1, BL2, . . . in the bit line direction. Upper word lines HWL1 to HWL4, . . . are arranged at a different layer from the layer of the bit lines and the source lines (e.g., on the bit line layer) to overlap the lower word lines. The lower word lines LWL1 to LWL4, . . . are connected to the upper word lines HWL1 to HWL4, . . . by contacts CON to form word lines WL1 to WL4. Gate polysilicon, which forms gates of the memory cells arranged in a word line direction, is arranged so that only portions connected by one contact CON are connected. In the depicted example, gate polysilicon forming the lower word lines LWL1, LWL3, . . . is divided into two portions, and gate polysilicon forming the lower word lines LWL2, LWL4, . . . is divided into three portions.

In the memory cell array shown in FIG. 9, the word lines are separately arranged, thereby reducing word line load.

Figure 10A:
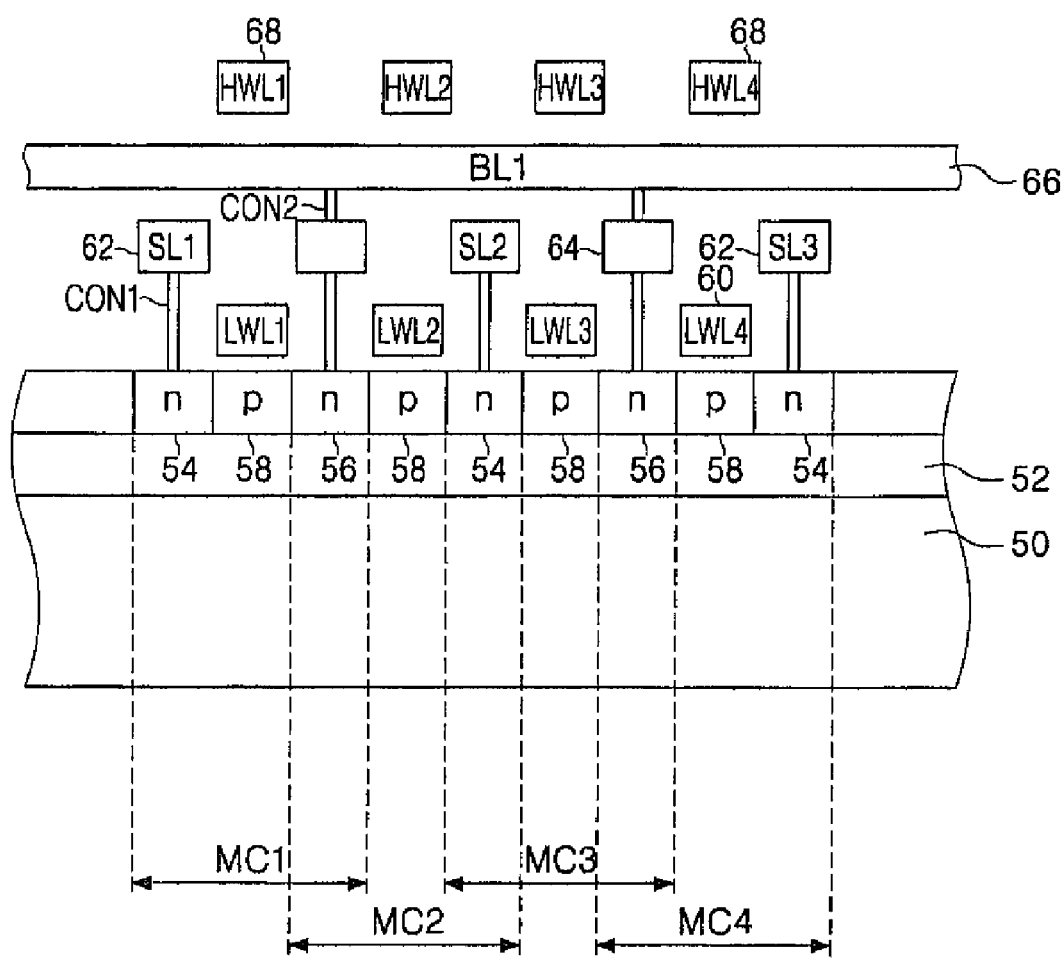
FIGS. 10A and 10B are cross-sectional views of the memory cell array taken along line X-X' and line Y-Y' in FIG. 9, respectively.
Figure 10B:
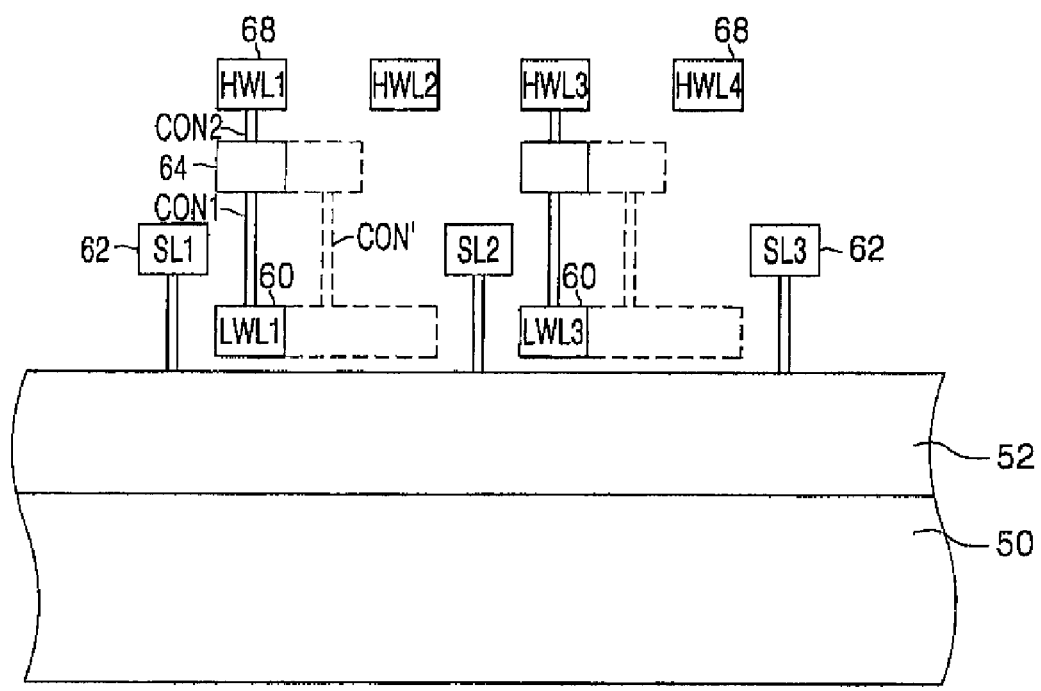

FIG. 10A is a cross-sectional view of the memory cell array taken along line X-X' in FIG. 9, and FIG. 10B is a cross-sectional view taken along line Y-Y' in FIG. 9.

The structure shown in FIG. 10A is substantially the same as that shown in FIG. 5, except that upper word lines HWL1 to HWL4 68 are additionally arranged on the layer of the bit line BL1 to be insulated from the bit line BL1 and overlap the lower word lines LWL1 to LWL4 60, respectively.

Alternatively, the memory cell array shown in FIG. 9 may include the cross-sectional structures shown in FIGS. 6 to 7, in which upper word lines HWL1 to HWL4 may be additionally arranged in the structures shown in FIGS. 6 to 7.

The structure shown in FIG. 10B includes a substrate 50, an insulating layer 52 formed on the substrate 50, and lower word lines LWL1 and LWL3 60 formed of gate polysilicon on the insulating layer 52. Source lines SL1 to SL3 62 are formed of metal on the layer of the lower word lines LWL1 and LWL3 60 to be insulated from the lower word lines LWL1 and LWL3 60. Landing pads 64 are formed of metal on the layer of the source lines SL1 to SL3 62 to be insulated from the source lines SL1 to SL3 and overlap the lower word lines LWL1 and LWL3 60. Upper word lines HWL1 to HWL4 68 are formed on the layer of the landing pads 64 to be insulated from landing pads 64 and overlap the landing pads 64. The landing pads 64 are connected with the lower word lines LWL1 and LWL3 60 by contacts CON1 and with the upper word lines HWL1 to HWL4 68 by contacts CON2, respectively. The upper word lines HWL1 to HWL4 68 are arranged on a layer of the bit line BL1. Each of the lower word lines LWL1 and LWL3 60 may extend as indicated by dotted lines, and each of the landing pads 64 may extend as indicated by dotted lines, as well. Accordingly, the contact CON1 may be substituted by a contact CON' indicated by dotted lines. As a result, word line load can be reduced.

Figure 11:
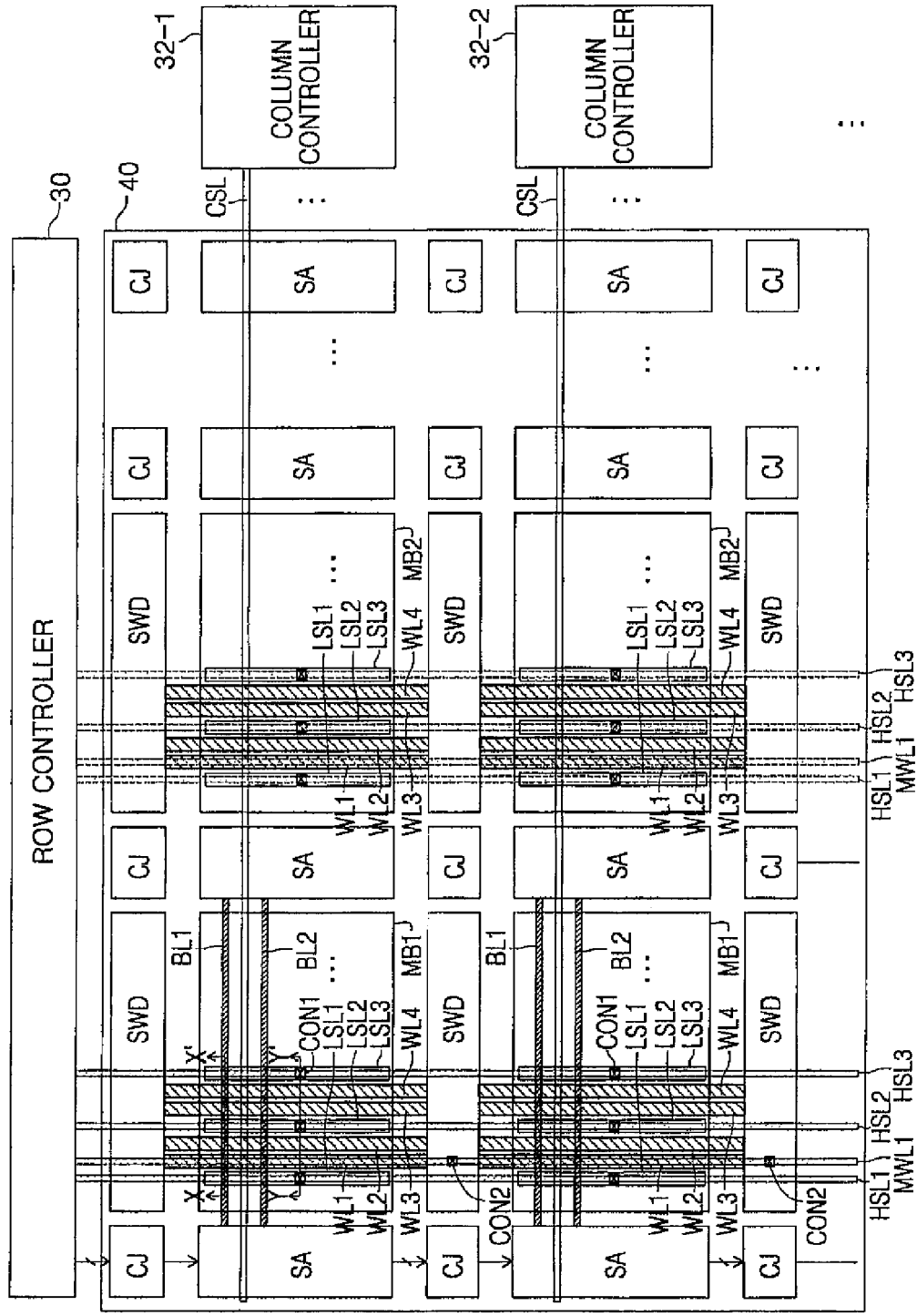
FIG. 11 is a layout of a first type of memory cell array including dynamic memory cells using floating body transistors, according to a fourth example embodiment.

FIG. 11 is a layout of a first type of memory cell array, having the structure shown in FIG. 2, for example, including dynamic memory cells using floating body transistors, according to a fourth illustrative embodiment.

In FIG. 11, the memory cell array includes a row controller 30, column controllers 32-1, 32-2, . . . and a cell array 40. The cell array 40 includes conjunctions CJ and sub word line drivers SWD alternately arranged in a bit line direction, and sense amplifiers SA and cell blocks alternately arranged in the bit line direction. Likewise, the conjunctions CJ and the sense amplifiers SA are alternately arranged in a word line direction, and the sub word line drivers SWD and the cell blocks are alternately arranged in the word line direction. Each sense amplifier SA is shared by the cell blocks between which it is arranged.

In FIG. 11, gate polysilicon for forming gates of memory cells arranged in the word line direction serves as word lines WL1 to WL4, . . . . Respective lower source lines LSL1 to LSL3, . . . of the cell blocks are arranged on the region of the word lines WL1 to WL4, . . . . Bit lines BL1, BL2, . . . are arranged on a layer of the lower source lines LSL1 to LSL3, . . . . Upper source lines HSL1 to HSL3, . . . and main word lines MWL1, . . . are arranged on the layer of the bit lines BL1, BL2, . . . in a direction perpendicular to the bit line. The upper source lines HSL1 to HSL3, . . . are arranged to overlap the lower source lines LSL1 to LSL3, respectively. Column selection signal lines CSL are arranged at the same layer as the bit lines BL1, BL2, . . . or at a different layer from the layer of the lower source lines LSL1 to LSL3, . . . , the upper source lines HSL1 to HSL3, . . . and the bit lines BL1, BL2, . . . in the bit line direction. In each cell block, the respective lower source lines LSL1 to LSL3, . . . are connected with the upper source lines HSL1 to HSL3, . . . by contacts CON1, the respective main word lines MWL1, . . . are connected by contacts CON2 in the sub word line driver SWD, and the sub word line driver SWD selects the word lines WL1 to WL4, . . . using a combination of a main word signal on the main word lines MWL1, . . . and a signal from the conjunctions CJ. When four signals are received from the conjunctions CJ, the sub word line driver SWD can combine a signal on the main word line MWL1 with the four signals from the conjunctions CJ to drive the four word lines WL1 to WL4.

In the layout of FIG. 11, since only the main word line driver (not shown) configured to drive the main word line MWL1 is arranged in the row controller 30 and word line drivers (not shown) configured to drive the word lines WL1 to WL4, . . . are arranged in the sub word line driver SWD, the layout area of the row controller 30 extending in the direction of the bit line can be reduced. Also, source line drivers (not shown) and main word line drivers (not shown) may be arranged on different rows in the bit line direction in the row controller 30 to further reduce the layout area in the bit line direction. In the layout of FIG. 11, since the lower source lines and the word lines are separately arranged, a load of the source and word lines can be reduced and accordingly a signal can be transmitted efficiently.

Figure 12A:
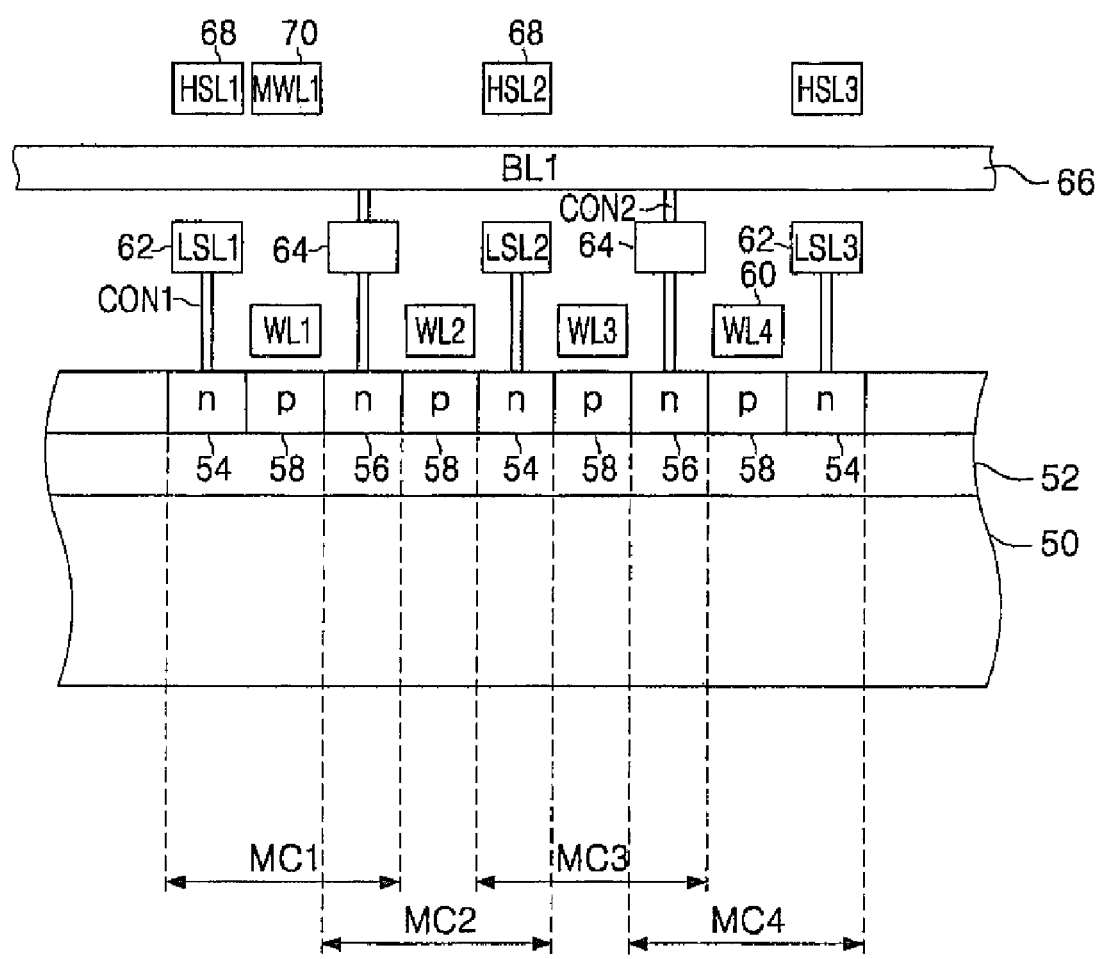
FIGS. 12A and 12B are cross-sectional views of the memory cell array taken along line X-X' and line Y-Y' in FIG. 11, respectively.
Figure 12B:
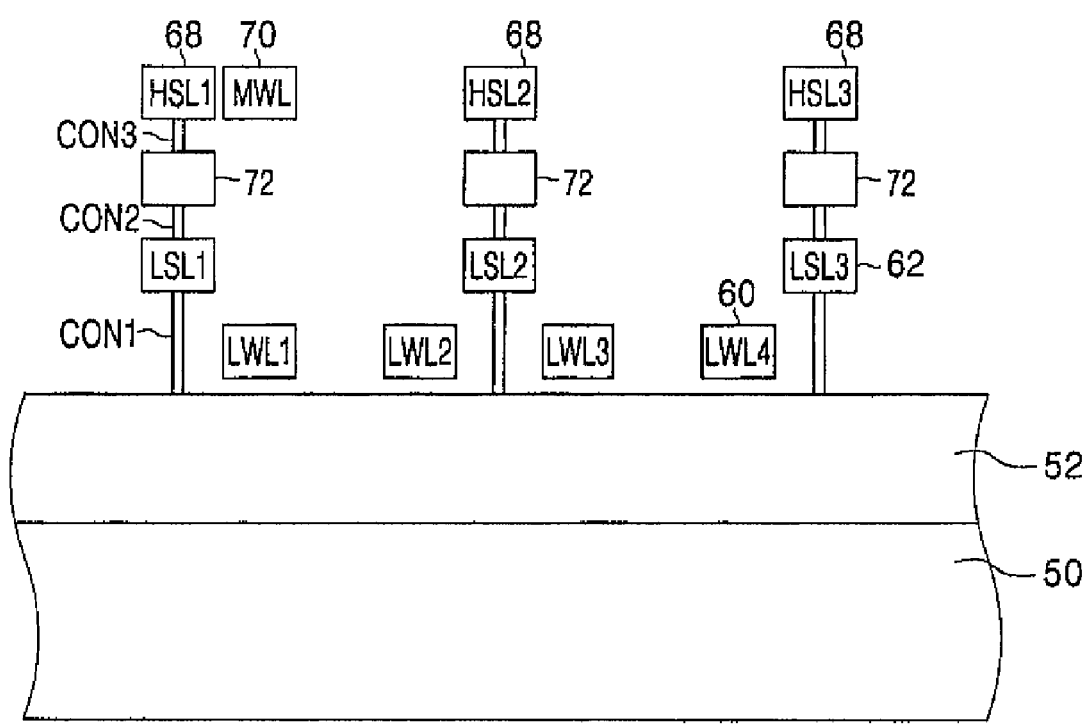

FIG. 12A is a cross-sectional view of the memory cell array taken along X-X' in FIG. 11, and FIG. 12B is a cross-sectional view taken along line Y-Y' in FIG. 11.

The structure shown in FIG. 12A is substantially the same as that shown in FIG. 5, except that upper source lines HSL1 to HSL3 68 and a main word line MWL1 70 are additionally formed on the layer of the bit line BL1 in the structure shown in FIG. 5.

The source lines SL1 to SL3 in the structure shown in FIG. 5 serve as lower source lines LSL1 to LSL3 62 in the structure shown in FIG. 12A, and the word lines WL1 to WL4 serve as sub word lines WL1 to WL4 60 in the structure shown in FIG. 12A.

Alternatively, each cell block in the memory cell array shown in FIG. 11 may include the cross-section structures shown in FIGS. 6 and 7, rather than the structure shown in FIG. 12A.

The structure shown in FIG. 12B includes a substrate 50, an insulating layer 52 formed on the substrate 50, and word lines WL1 to WL4 60 formed of gate polysilicon on the insulating layer 52. Lower source lines LSL1 to LSL3 62 are formed of metal on a layer of the word lines WL1 to WL4 60 to be insulated from the word lines WL1 to WL4 60. Landing pads 72 are formed of metal on a layer of the lower source lines LSL1 to LSL3 62, that is, at the same layer as the bit line BL1 to be insulated from and overlap the lower source lines LSL1 to LSL3 62. Upper source lines HSL1 to HSL3 68 are formed on a layer of the landing pads 72 to be insulated from and overlap the landing pads 72. A main word line MWL1 70 is formed at the same layer as the upper source lines HSL1 to HSL3 68. The lower source lines LSL1 to LSL3 62 are connected with the landing pads 72 by contacts CON2, and the upper source lines HSL1 to HSL3 68 are connected with the landing pads 72 by contacts CON3. Although the lower source lines LSL1 to LSL3 62 are shown as being connected with the insulating layer 52 by contacts CON1, they may not be connected with the insulating layer 52, in an alternative embodiment. Also, although the lower source lines LSL1 to LSL3 62 are connected with the upper source lines HSL1 to HSL3 68, respectively, through the landing pads 72, the lower source lines LSL1 to LSL3 62 may be directly connected with the upper source lines HSL1 to HSL3 68 by contacts in an alternative embodiment.

Figure 13:
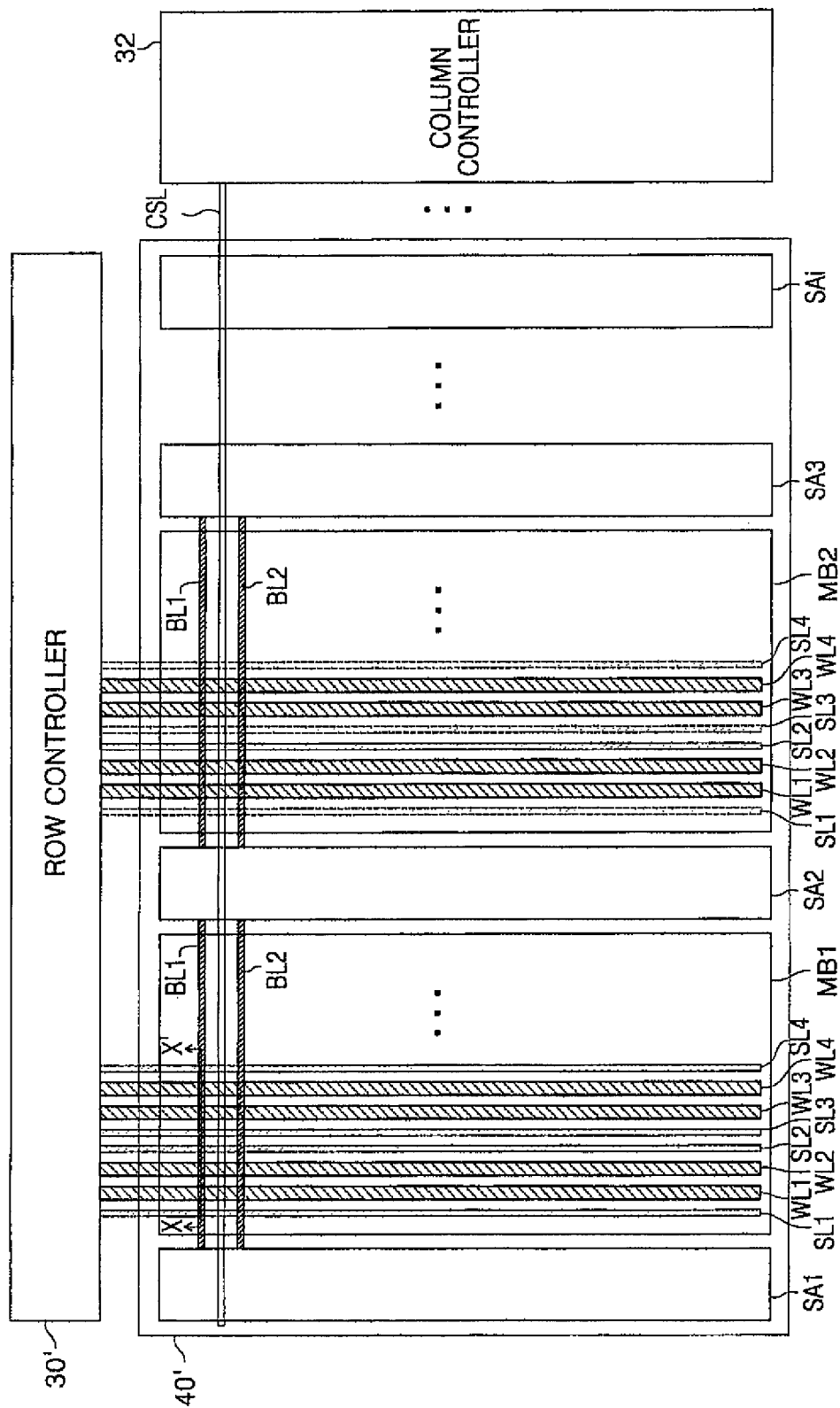
FIG. 13 is a layout of a second type of memory cell array including dynamic memory cells using floating body transistors, according to a fifth example embodiment.

FIG. 13 is a layout of a second type of memory cell array, having the structure shown in FIG. 3, for example, including dynamic memory cells using floating body transistors, according to a fifth illustrative embodiment.

The memory cell array shown in FIG. 13 includes a row controller 30', a column controller 32, and a cell array 40'. In the layout of the memory cell array shown in FIG. 13, a source line SL3 is additionally arranged between the source line SL2 and the word line WL3 shown in FIG. 4, and additional source line SL4 is arranged next to the word line WL4, which was the location of source line SL3 in FIG. 4.

Figure 14:
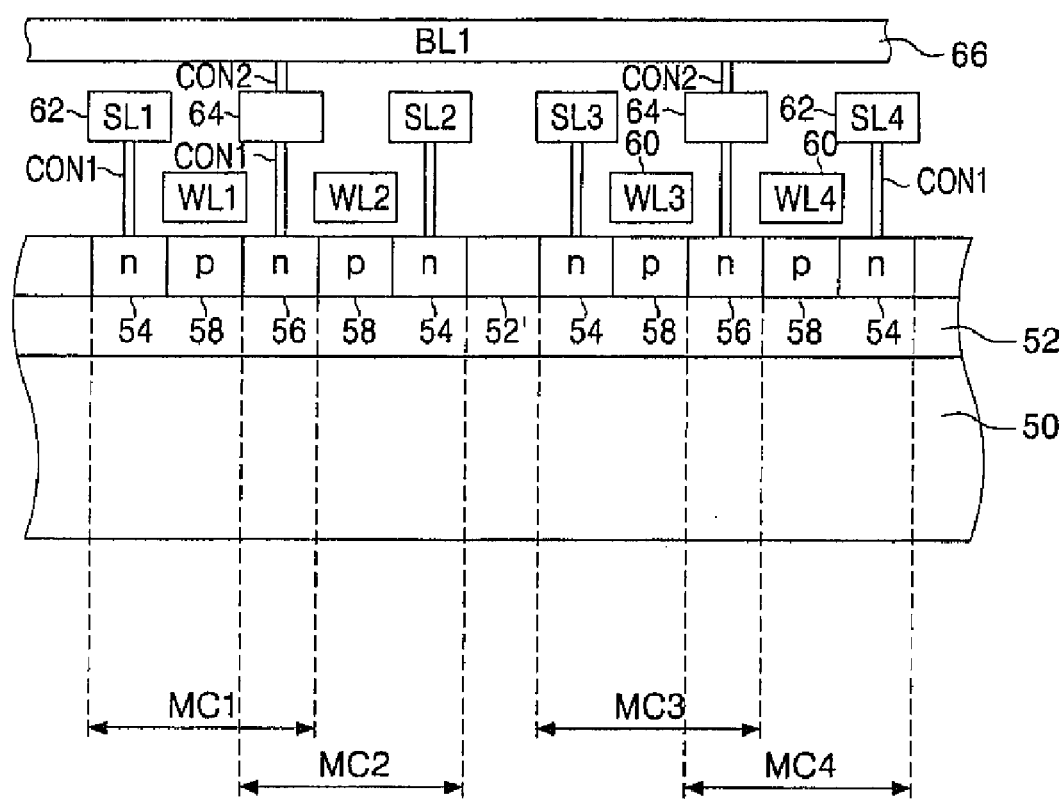
FIG. 14 is a cross-sectional view of the cell block taken along line X-X' in FIG. 13, according to an embodiment.

FIG. 14 is a cross-sectional view of the cell block taken along line X-X' in FIG. 13, according to an illustrative embodiment. The structure shown in FIG. 14 is substantially the same as that previously discussed with respect to FIG. 5, except that there are four source regions 54 and the source regions 54 of the memory cells MC2 and MC3 are separately formed with an insulator 52' located between them. Also, a source line SL2 is arranged on a layer of a gate region 60 of the memory cell MC2 to overlap the source region 54 of the memory cell MC2, and a source line SL3 is arranged on a layer of a gate region 60 of the memory cell MC3 to overlap the source region 54 of the memory cell MC3. First and fourth source lines SL1 and SL4 are arranged on a layer of gate regions 60 of the memory cells MC1 and MC4, respectively, to overlap the source regions 54. Thus, each of the four source regions 54 is overlapped by a source line SL1 to SL4, respectively.

Figure 15:
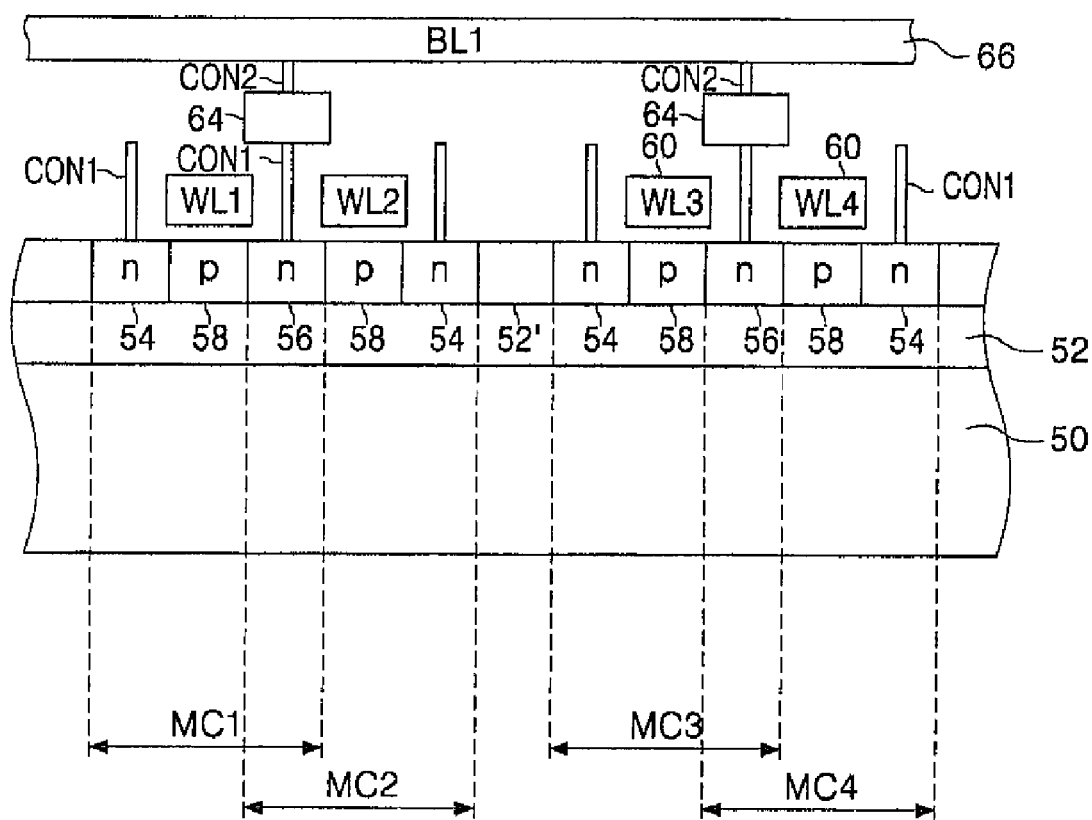
FIG. 15 is a cross-sectional view of the cell block taken along line X-X' in FIG. 13, according to another embodiment.
Figure 16:
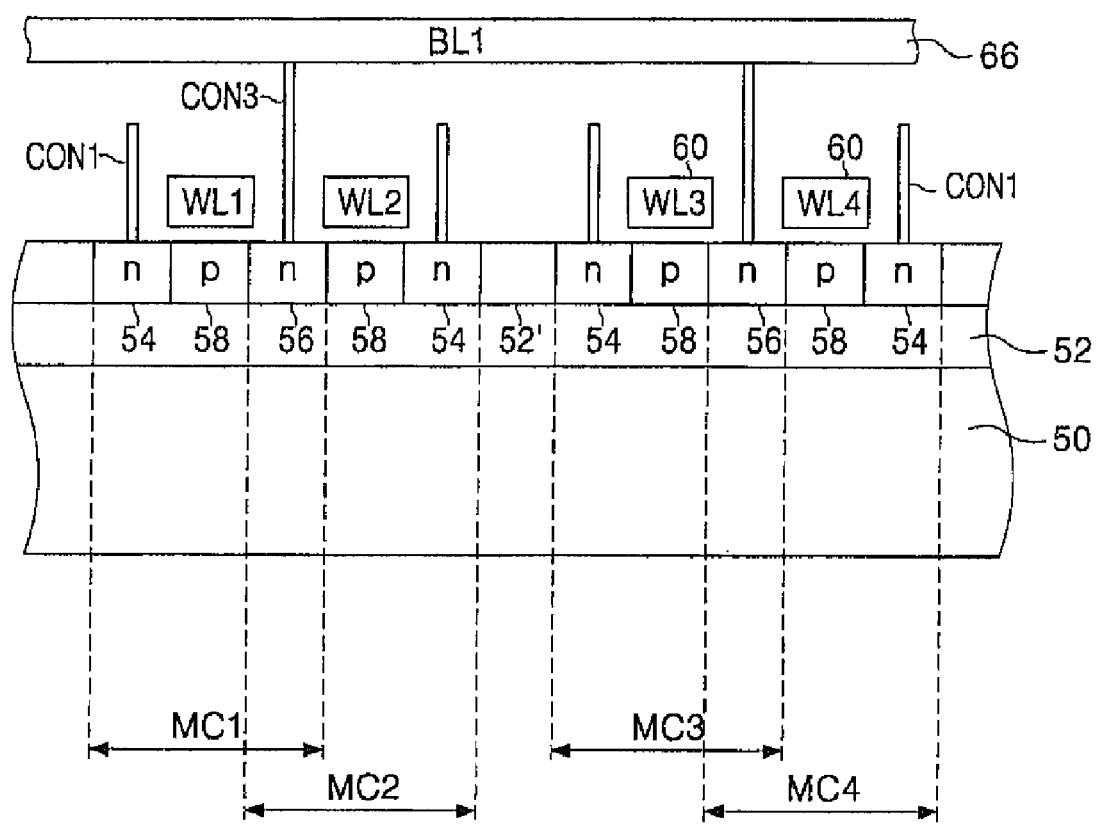
FIG. 16 is a cross-sectional view of the cell block taken along line X-X' in FIG. 13, according to yet another embodiment.

FIGS. 15 and 16 are cross-sectional views of the cell block taken along line X-X' in FIG. 13, according to other illustrative embodiments. The structures of FIGS. 15 and 16 are substantially the same as those depicted in FIGS. 6 and 7, respectively, except that there are four source regions 54 and the source regions 54 of memory cells MC2 and MC3 are separately formed with an insulator 52' located between them. The source lines SL1 to SL4 are arranged to overlap the source regions 54 of the memory cells MC1 to MC4, as in FIG. 14.

Figure 17:
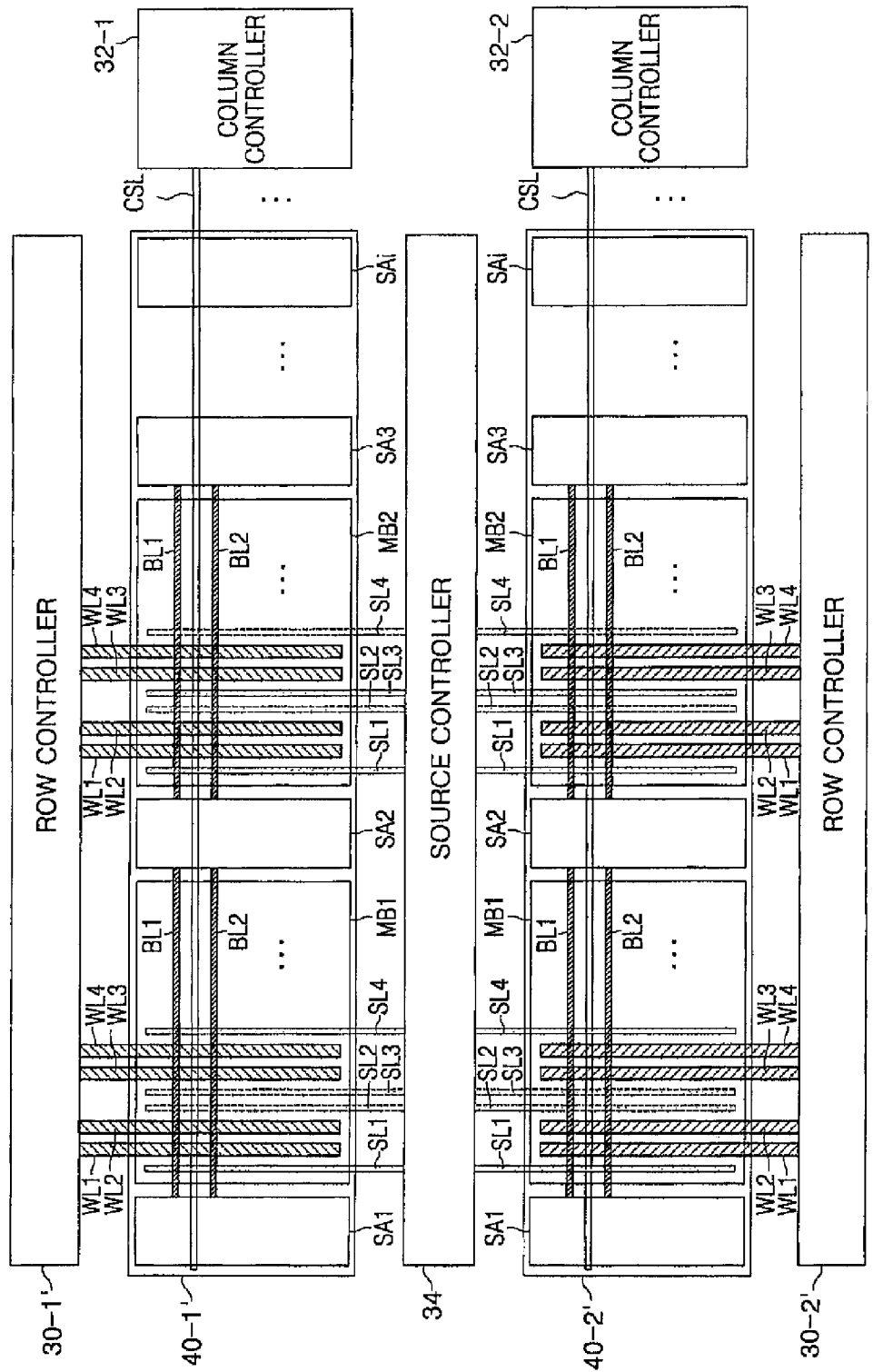
FIG. 17 is a layout of a second type of memory cell array including dynamic memory cells using floating body transistors, according to a sixth example embodiment.

FIG. 17 is a layout of a second type of memory cell array, having the structure shown in FIG. 3, for example, including dynamic memory cells using floating body transistors, according to a sixth illustrative embodiment.

The memory cell array shown in FIG. 17 includes row controllers 30-1' and 30-2', a source controller 34, column controllers 32-1 and 32-2, and cell array 40-1' and 40-2'. The layout of the memory cell array shown in FIG. 17 is substantially the same as that previously discussed with respect to FIG. 8, except that an additional source line, indicated as source line SL3, is arranged between the source line SL2 and the word line WL3 in the memory cell arrays. Also, source line SL4 is arranged next to the word line WL4, which was the location of source line SL3 in FIG. 8.

A cross-sectional view of the cell blocks of the memory cell array taken along line X-X' in FIG. 17 may have the structure of the various embodiments shown in FIGS. 14 to 16, discussed above.

Figure 18:
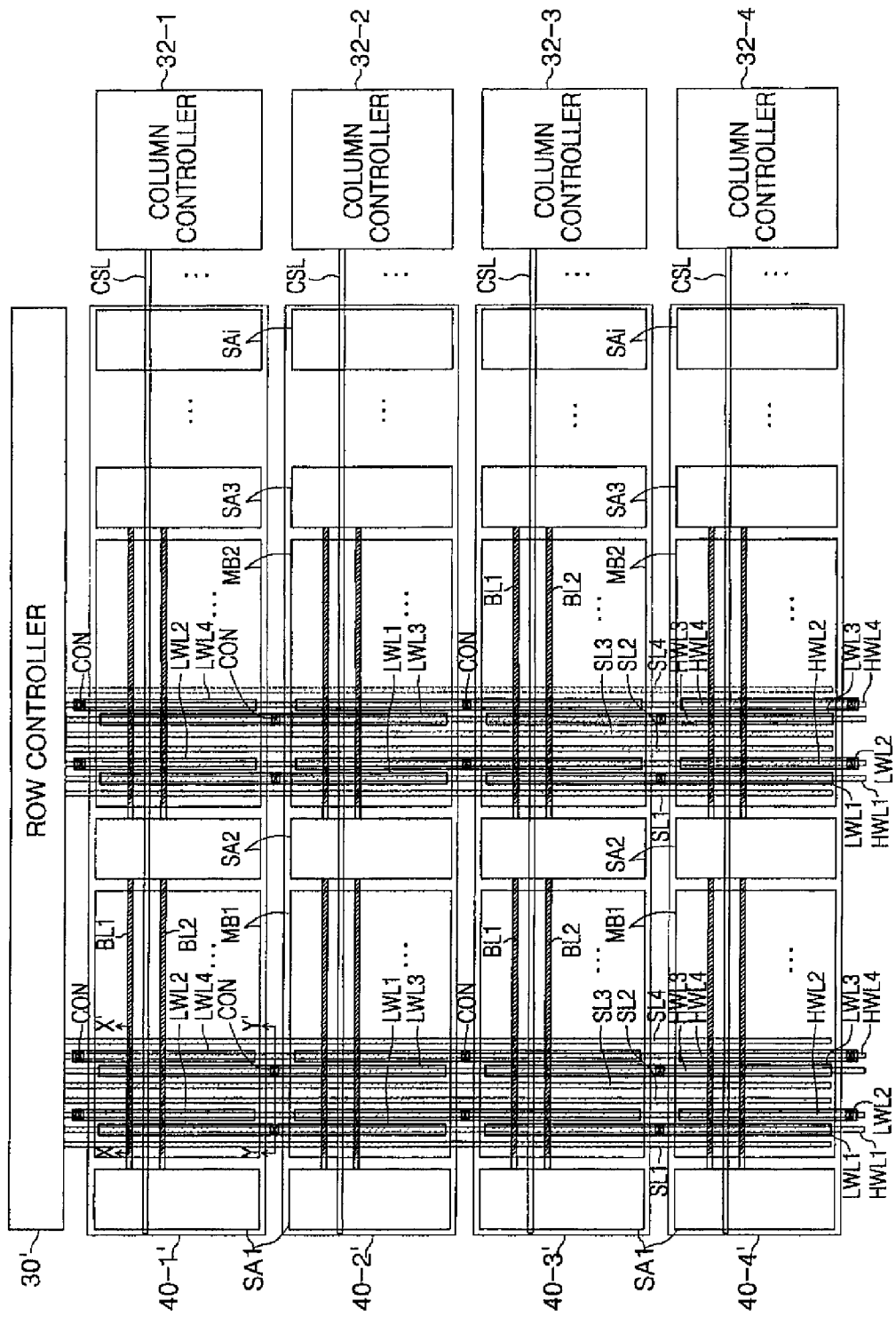
FIG. 18 is a layout of a second type of memory cell array including dynamic memory cells using floating body transistors, according to a seventh example embodiment.

FIG. 18 is a layout of a second type of memory cell array, having the structure shown in FIG. 3, for example, including dynamic memory cells using floating body transistors, according to a seventh illustrative embodiment.

The memory cell array shown in FIG. 18 includes a row controller 30', column controllers 32-1 to 32-4, and cell arrays 40-1' to 40-4'. The layout of the memory cell array shown in FIG. 18 is substantially the same as that previously discussed with respect to FIG. 9, except that an additional source line, indicated as source line SL3, is arranged between the source line SL2 and the word line LWL3 in the memory cell arrays. Also, source line SL4 is arranged next to the word line HWL4, which was the location of source line SL3 in FIG. 9.

Figure 19A:
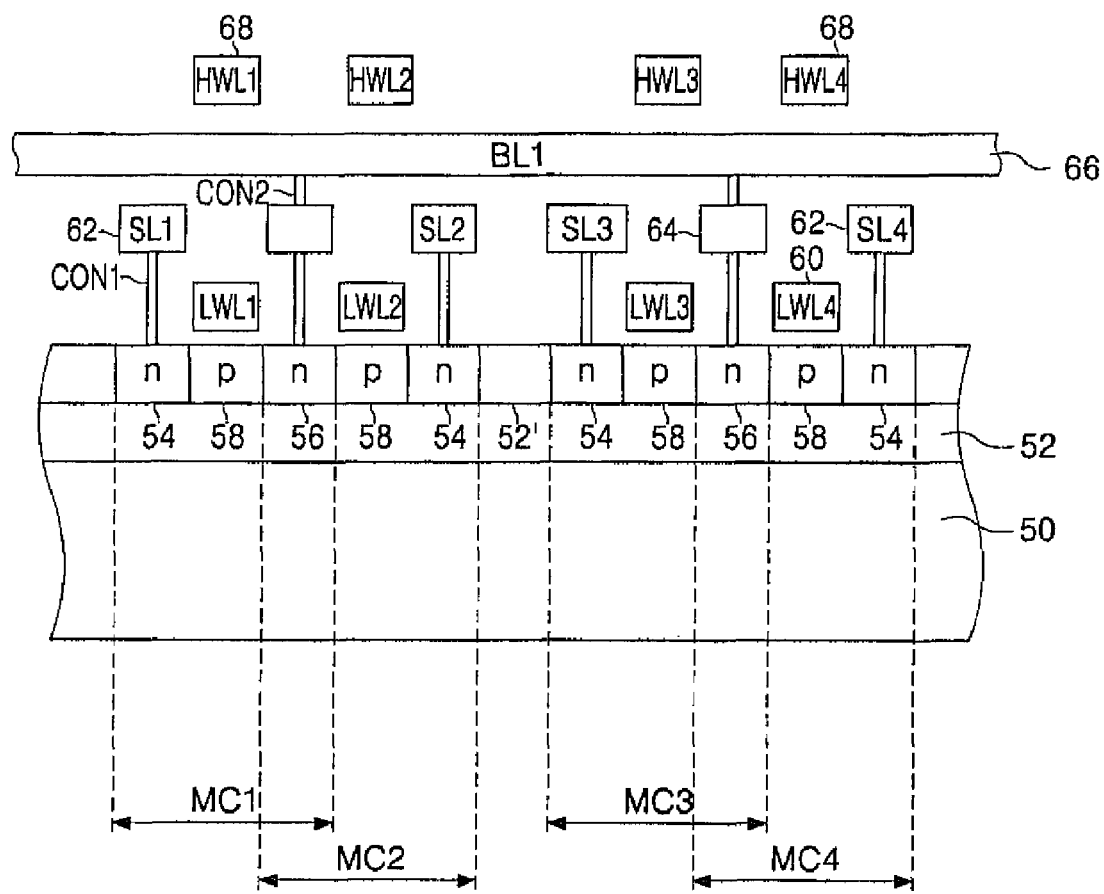
FIGS. 19A and 19B are cross-sectional views of the memory cell array taken along line X-X' and line Y-Y' in FIG. 18, respectively.
Figure 19B:
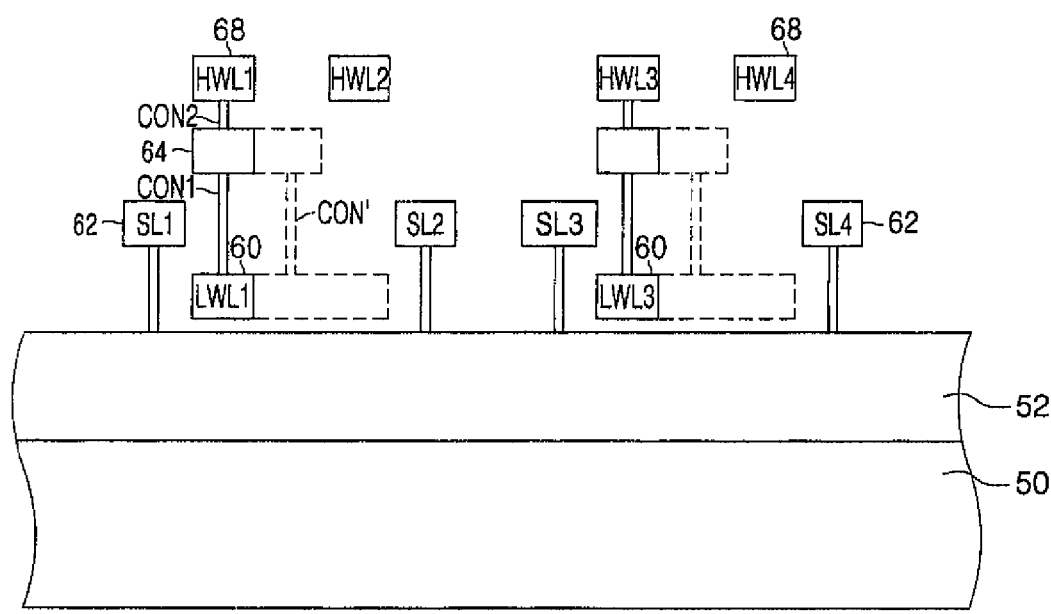

FIG. 19A is a cross-sectional view of the memory cell array taken along line X-X' in FIG. 18, and FIG. 19B is a cross-sectional view taken along line Y-Y' in FIG. 18. The structures shown in FIGS. 19A and 19B are substantially the same as those shown in FIGS. 10A and 10B, except that source regions 54 are separately formed with an insulator 52' between them. Also, there are four source regions 54, corresponding to memory cells MC1 to MC4, each of which is overlapped by a source line SL1 to SL4, respectively.

Figure 20:
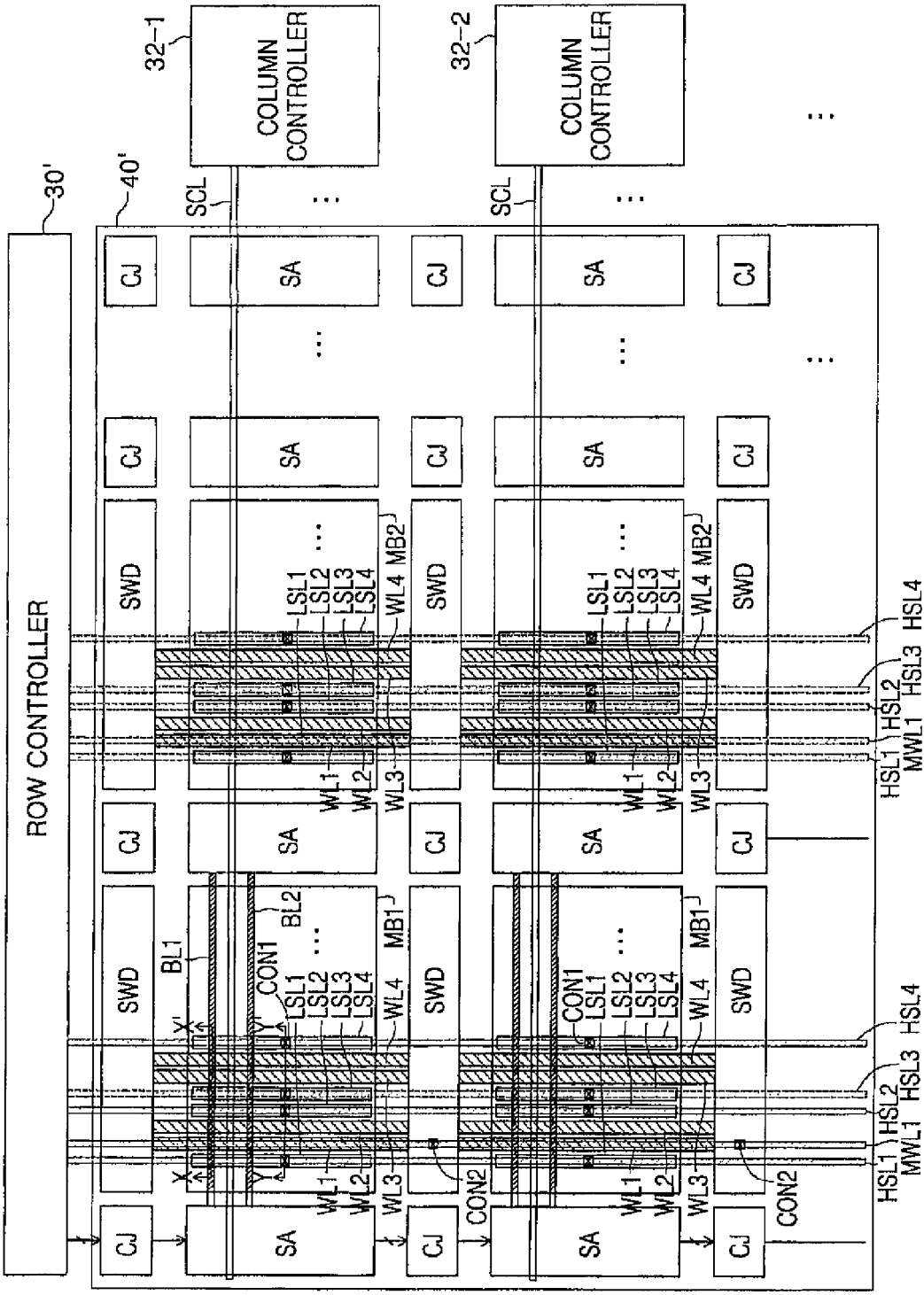
FIG. 20 is a layout of a second type of memory cell array including dynamic memory cells using floating body transistors, according to an eighth example embodiment.

FIG. 20 is a layout of a second type of memory cell array, having the structure shown in FIG. 3, for example, including dynamic memory cells using floating body transistors, according to an eight illustrative embodiment.

The memory cell array shown in FIG. 20 includes a row controller 30', column controllers 32-1 and 32-2, and a cell array 40'. The cell array 40' includes conjunctions CJ and sub word line drivers SWD alternately arranged in a bit line direction, and sense amplifiers SA and cell blocks alternately arranged in the bit line direction. Likewise, the conjunctions CJ and the sense amplifiers SA are alternately arranged in a word line direction, and the sub word line drivers SWD and the cell blocks are alternately arranged in the word line direction. Each sense amplifier SA is shared by the cell blocks between which it is arranged.

Accordingly, the layout of the memory cell array shown in FIG. 20 is substantially the same as that previously discussed with respect to FIG. 11, except that additional lower and upper source lines, indicated as lower source line LSL3 and upper source line HSL3, are respectively arranged between the lower source line LSL2 and the word line WL3, and between the upper source line HSL2 and the word line WL3, in the memory cell arrays. Also, lower source line LSL4 and upper source line HSL4 are located next to the word line WL4, which were the locations of lower source line LSL3 and upper source line HSL3 in FIG. 11.

Figure 21A:
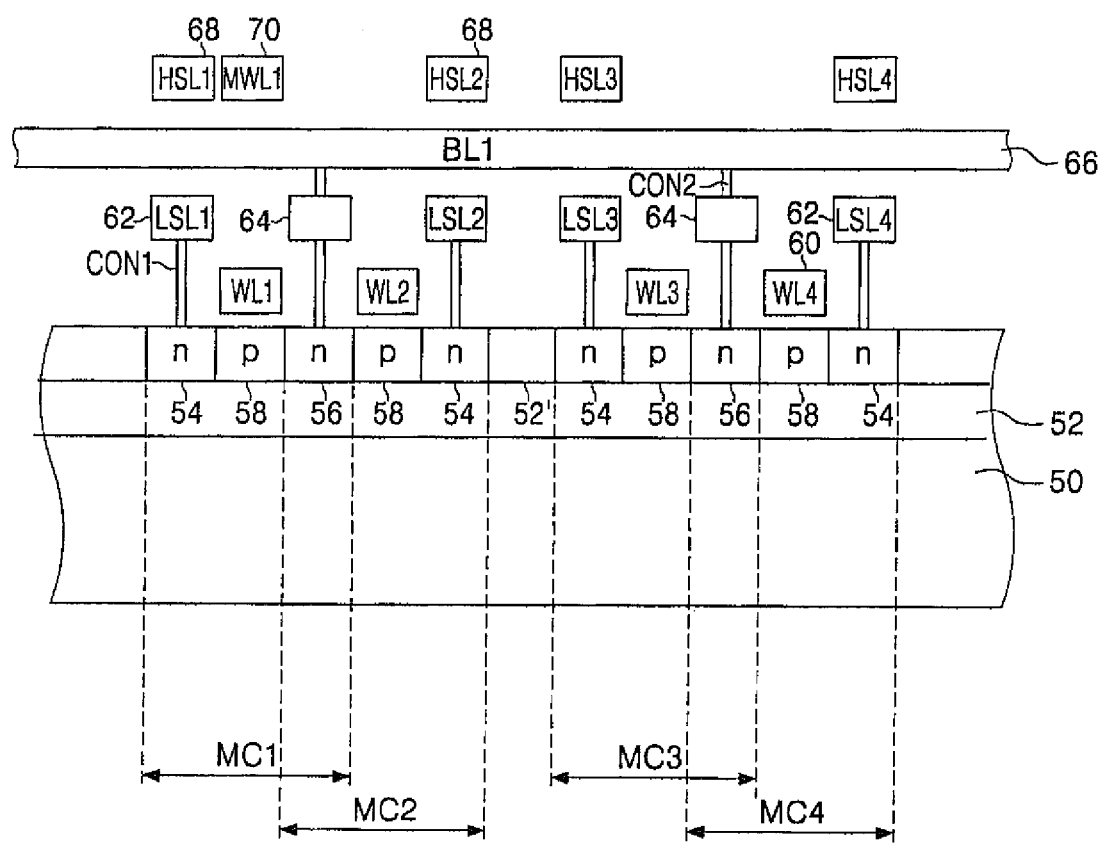
FIGS. 21A and 21B are cross-sectional views of the memory cell array taken along line X-X' and line Y-Y' in FIG. 20, respectively.
Figure 21B:
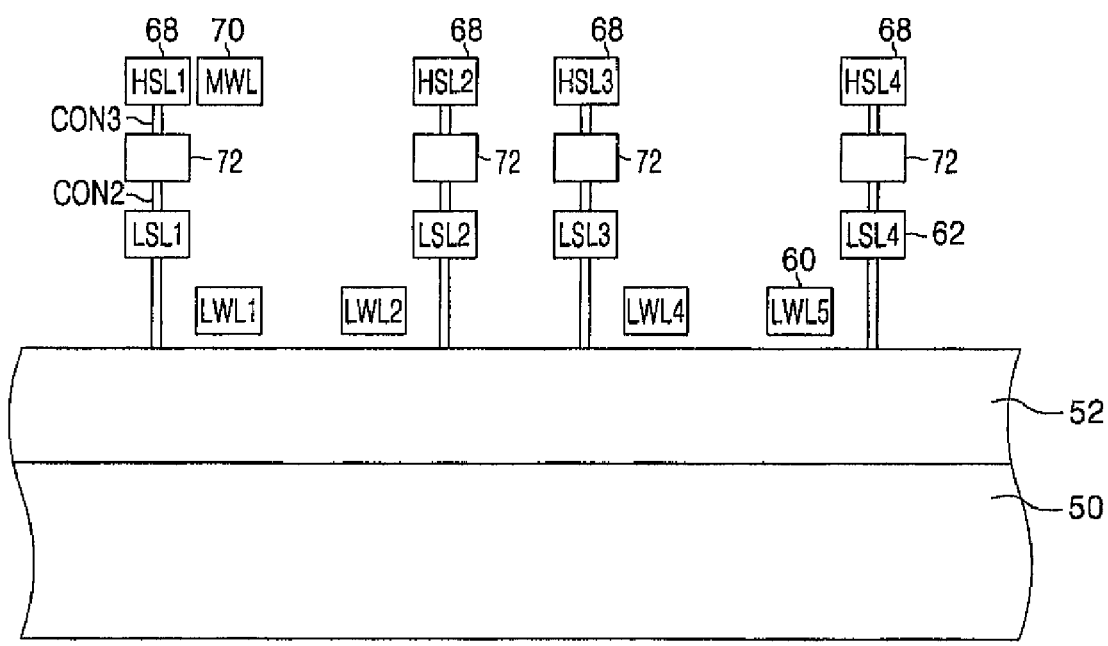

FIG. 21A is a cross-sectional view of the memory cell array taken along line X-X' in FIG. 20, and FIG. 21B is a cross-sectional view taken along line Y-Y' in FIG. 20. The structures shown in FIGS. 21A and 21B are the substantially same as those shown in FIGS. 12A and 12B, except that source regions 54 are separately formed with an insulator 52' between them. Also, there are four source regions 54, corresponding to memory cells MC1 to MC4, which are respectively overlapped by source lines LSL1/HSL1 to LSL4/HSL4.

The illustrative embodiments described above include bit lines arranged on the layer of source lines, and upper source lines/upper word lines/main word lines arranged on the layer of the bit lines. However, in the various embodiments, it is understood that the source lines, the bit lines, and the upper source lines/upper word lines/main word lines need only to be arranged on different layers.

According to the illustrative embodiments, the layout and structure of the memory cell array including dynamic memory cells using floating body transistors can reduce a line load and lead to efficient signal transmission, for example.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A semiconductor memory device comprising:
a memory cell array comprising a cell array having a plurality of cell blocks, each cell block comprising source lines, word lines and overlapping word lines arranged in the same direction, bit lines arranged in a direction perpendicular to the word lines, and a plurality of memory cells having a corresponding plurality of floating bodies,
wherein adjacent memory cells of the plurality of memory cells, which are adjacent in a bit line direction, share source regions or drain regions to form common source regions or common drain regions, respectively, the source regions being arranged in a word line direction and connected to corresponding source lines, and the drain regions being arranged in the bit line direction and connected to corresponding bit lines,
wherein gates of the memory cells are arranged in the word line direction and are connected to form the word lines,
wherein the word lines are formed at a word line layer, the source lines are formed at a source line layer over the word line layer to be insulated from the word lines, the bit lines are formed at a bit line layer over the source line layer to be insulated from the word lines and the source lines, and the overlapping word lines are formed at an overlapping word line layer over the bit line layer and overlap the word lines in a word line direction.

2. The device of claim 1, wherein the source lines overlap the common source regions arranged in the word line direction.

3. The device of claim 1, wherein the gate comprises polysilicon.

4. The device of claim 1, wherein the source lines and the bit lines comprise metal.

5. The device of claim 4, wherein the bit lines overlap the common drain regions arranged in the bit line direction.

6. The device of claim 5, wherein the common drain regions and the overlapping bit lines are interconnected by first contacts.

7. The device of claim 5, wherein landing pads are arranged at the source line layer to overlap the common drain regions, and
the common drain regions and the overlapping landing pads are interconnected by second contacts, and the landing pads and the bit lines overlapping the common drain regions are interconnected by third contacts.

8. The device of claim 5, wherein first contacts are formed in the common source regions, and the first contacts arranged in the word line direction are connected to form the source lines.

9. The device of claim 2, wherein the source lines and the common source regions overlapped by the source lines are interconnected by first contacts.

10. The device of claim 8, wherein the memory cell array further comprises:
a plurality of sense amplifiers arranged between the plurality of cell blocks for sensing data on the bit line;
a row controller arranged at one side of the cell array and at respective ends of the word lines, for controlling the word lines and the source lines; and
a column controller arranged at the another side of the cell array and at respective ends of the bit lines, for controlling the bit lines.

11. The device of claim 8, wherein the memory cell array further comprises:
at least two cell arrays arranged in the word line direction;
a row controller arranged at one side of the memory cell array and at respective ends of the word lines, for controlling the word lines and the source lines; and
at least two column controllers arranged at another side of the at least two cell arrays and at respective ends of the bit lines of the at least two cell arrays, for controlling the bit lines.

12. The device of claim 1, wherein the overlapping word lines comprise metal.

13. The device of claim 11, wherein the overlapping word lines overlap the word lines between the at least two cell arrays and are interconnected by second contacts.

14. The device of claim 11, wherein landing pads are additionally arranged at the source line layer to overlap the common drain regions, and
the word lines and respective overlapping word lines are connected between the at least two cell arrays.

15. The device of claim 14, wherein the landing pads are additionally arranged at the bit line layer between the at least two cell arrays to overlap the word lines and the respective overlapping word lines, and
the word lines and the overlapping landing pads are interconnected by second contacts, and the landing pads and the overlapping respective overlapping word lines are interconnected by third contacts.

16. A semiconductor memory device, comprising:
a memory cell array comprising:
- first and second cell arrays arranged in the word line direction, each of the first and second cell arrays having a plurality of cell blocks, and each cell block comprising source lines and word lines arranged in the same direction, bit lines arranged in a direction perpendicular to the word lines, and a plurality of memory cells having a corresponding plurality of floating bodies;
- a plurality of sense amplifiers arranged between the plurality of cell blocks of each of the first and second cell arrays for sensing data on the bit line;
- a row controller arranged at one side of the first cell array and connected to respective ends of the word lines of the first cell array, for controlling the word lines;
- first and second column controllers arranged at one side of each of the first and second cell arrays, respectively, and connected to respective ends of the bit lines of the first and second cell arrays, for controlling the bit lines; and
- a source controller between the first cell array and the second cell array, on an opposite side of the first cell array from the row controller, and connected to respective ends of the source lines of both the first and second cell arrays for controlling the source lines, wherein adjacent memory cells of the plurality of memory cells, which are adjacent in a bit line direction, share source regions or drain regions to form common source regions or common drain regions, respectively, the source regions being arranged in a word line direction and connected to corresponding source lines, and the drain regions being arranged in the bit line direction and connected to corresponding bit lines, wherein gates of the memory cells are arranged in the word line direction and are connected to form the word lines, and wherein the word lines are formed at a word line layer, the source lines are formed at a source line layer over the word line layer to be insulated from the word lines, and the bit lines are formed at a bit line layer over the source line layer to be insulated from the word lines and the source lines.

17. A semiconductor memory device comprising:
a memory cell array comprising:
- at least two cell arrays arranged in the word line direction, each cell array having a plurality of cell blocks, and each cell block comprising source lines and word lines arranged in the same direction, bit lines arranged in a direction perpendicular to the word lines, and a plurality of memory cells having a corresponding plurality of floating bodies;
- sub word line drivers arranged between the cell blocks in the word line direction, for controlling the word lines;
- sense amplifiers arranged between the cell blocks in the bit line direction, for sensing data on the bit lines; and
- conjunctions alternately arranged between the sub word line drivers in the bit line direction and alternately arranged between the sense amplifiers in the word line direction, the conjunctions being configured to generate selection signals to select a sub word line, wherein adjacent memory cells of the plurality of memory cells, which are adjacent in a bit line direction, share source regions or drain regions to form common source regions or common drain regions, respectively, the source regions being arranged in a word line direction and connected to corresponding source lines, and the drain regions being arranged in the bit line direction and connected to corresponding bit lines, wherein gates of the memory cells are arranged in the word line direction and are connected to form the word lines, and wherein the word lines are formed at a word line layer, the source lines are formed at a source line layer over the word line layer to be insulated from the word lines, and the bit lines are formed at a bit line layer over the source line layer to be insulated from the word lines and the source lines.

18. The device of claim 17, wherein the source lines are formed to overlap the common source regions arranged in the word line direction.

19. The device of claim 18, wherein the bit lines are arranged to overlap the common drain regions arranged in the bit line direction.

20. The device of claim 19, wherein overlapping source lines are arranged at a different layer from the source line layer and the bit line layer and over the word line layer in the word line direction to overlap the source lines, and main word lines are arranged in the word line direction.

21. The device of claim 20, wherein the source lines are connected with the overlapping source lines by contacts, respectively.

22. The device of claim 21, wherein landing pads are additionally arranged at the bit line layer to be insulated from the bit lines and to overlap the source lines and the overlapping source lines, and
the source lines and the landing pads are interconnected by first contacts, and the landing pads and the overlapping source lines are interconnected by second contacts.

23. The device of claim 20, wherein the memory cell array further comprises:
- a row controller arranged at one side of the cell array and at respective ends of the word lines for controlling the overlapping source lines and the main word lines; and
- a column controller arranged at another side of the cell array and at respective ends of the bit lines for controlling the bit lines.

24. The device of claim 23, wherein the respective sub word line drivers combine signals on the main word lines with the selection signals to drive the word lines.

* * * * *